United States Patent
Takeoka et al.

(10) Patent No.: US 7,197,725 B2
(45) Date of Patent: Mar. 27, 2007

(54) SEMICONDUCTOR INTEGRATED CIRCUIT AND TESTING METHOD FOR THE SAME

(75) Inventors: Sadami Takeoka, Osaka (JP); Mitsuyasu Ohta, Osaka (JP); Osamu Ichikawa, Osaka (JP); Masayoshi Yoshimura, Kyoto (JP); Takashi Ishimura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 645 days.

(21) Appl. No.: 10/187,413

(22) Filed: Jul. 2, 2002

(65) Prior Publication Data

US 2003/0021464 A1    Jan. 30, 2003

(30) Foreign Application Priority Data

Jul. 3, 2001    (JP) .............................. 2001-202160

(51) Int. Cl.
*G06F 17/50* (2006.01)
(52) U.S. Cl. .............................................. 716/4; 716/5
(58) Field of Classification Search ................ 716/1–6, 716/18; 714/731, 718
See application file for complete search history.

(56) References Cited

U.S. PATENT DOCUMENTS

| | | | | |
|---|---|---|---|---|
| 5,509,019 A | * | 4/1996 | Yamamura ................... | 714/718 |
| 5,774,474 A | * | 6/1998 | Narayanan et al. ......... | 714/726 |
| 6,318,911 B1 | * | 11/2001 | Kitahara ........................ | 716/6 |
| 6,442,722 B1 | * | 8/2002 | Nadeau-Dostie et al. ... | 714/731 |
| 6,457,167 B1 | * | 9/2002 | Kitahara ....................... | 716/18 |
| 6,532,560 B1 | * | 3/2003 | Miyake ....................... | 714/731 |
| 6,651,224 B1 | * | 11/2003 | Sano et al. .................... | 716/2 |
| 6,718,523 B2 | * | 4/2004 | Hathaway et al. ............. | 716/4 |
| 2003/0018939 A1 | * | 1/2003 | Kinoshita et al. ........... | 714/742 |

* cited by examiner

*Primary Examiner*—Jack Chiang
*Assistant Examiner*—Binh Tat
(74) *Attorney, Agent, or Firm*—McDermott Will & Emery LLP

(57) ABSTRACT

A semiconductor integrated circuit of the present invention is provided with a clock control portion having a clock generation portion for generating a clock signal and an output command signal input portion for receiving a clock output command signal from the outside, and an internal circuit controlled by an output clock signal that is output from the clock control portion, and the clock control portion is configured so that it outputs the output clock signal to the internal circuit when a certain time period has passed from a time when the output command signal is received.

19 Claims, 25 Drawing Sheets

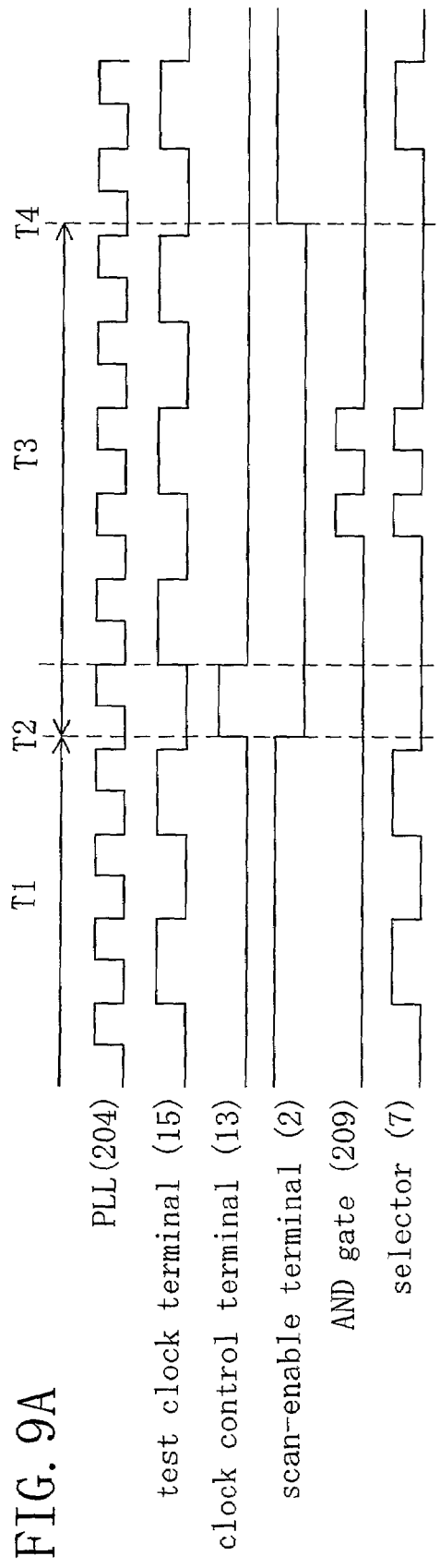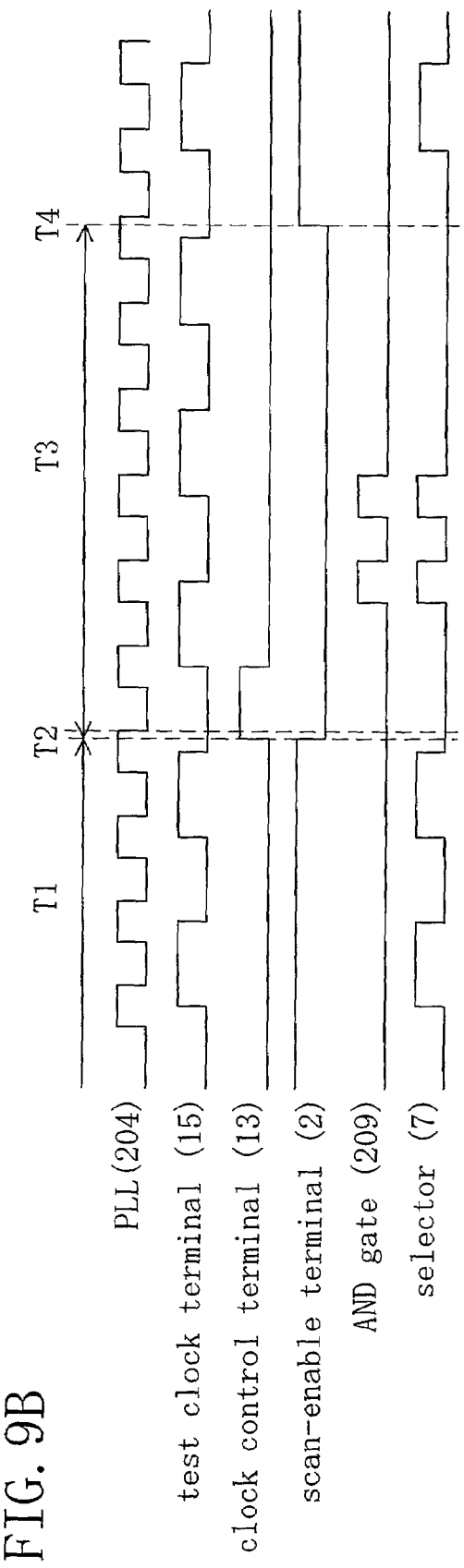

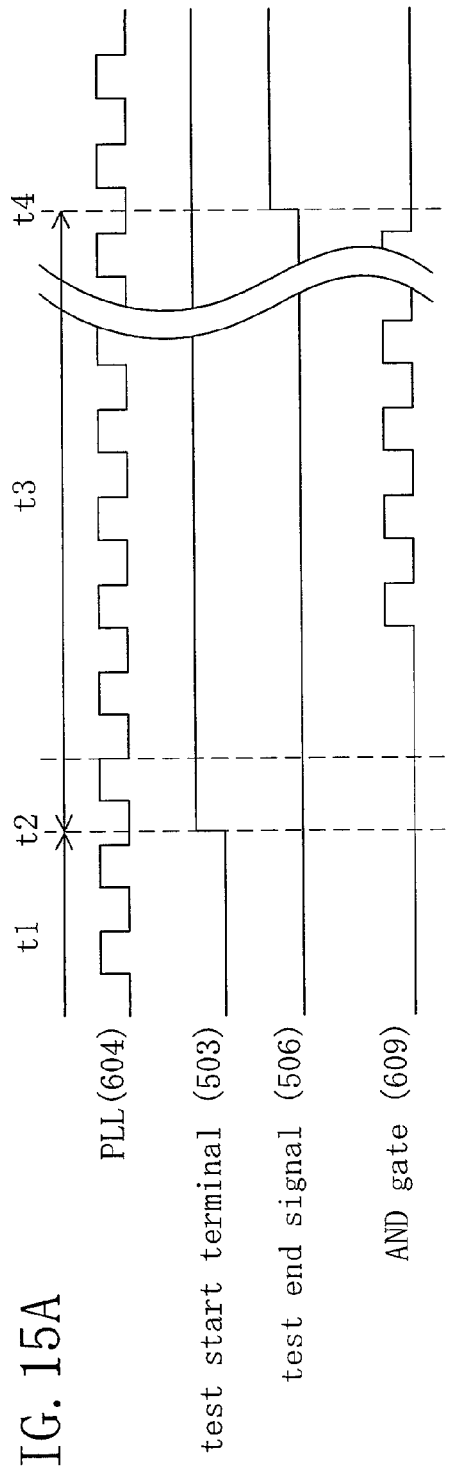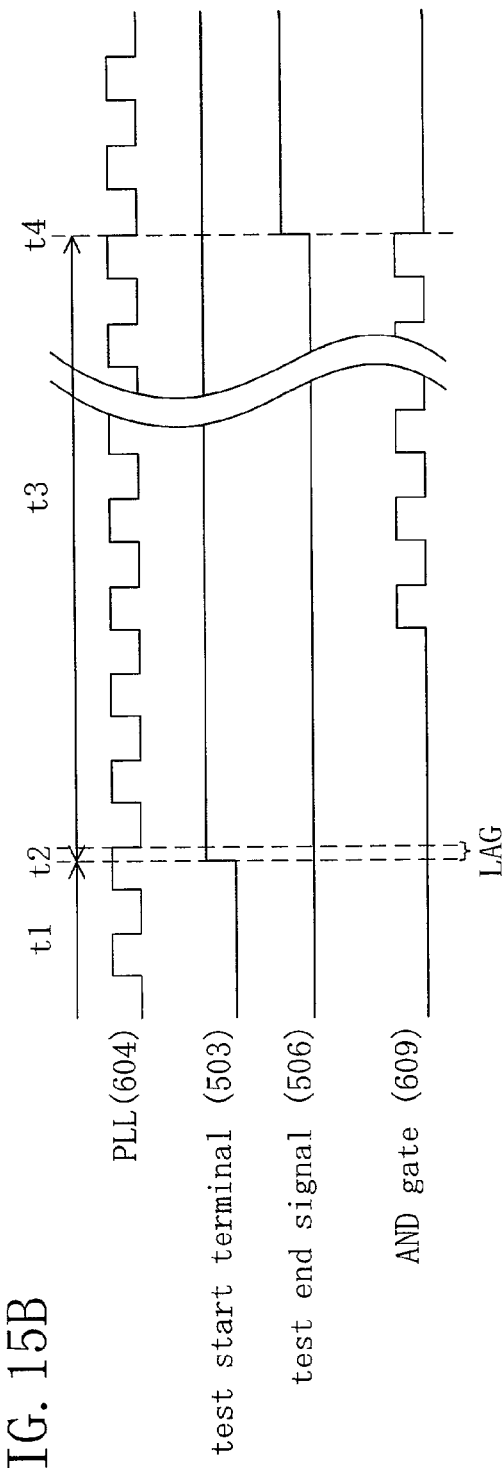

SEMICONDUCTOR INTEGRATED CIRCUIT AND TESTING METHOD FOR THE SAME

BACKGROUND OF THE INVENTION

The present invention relates to a semiconductor integrated circuit and a testing method for the same, and also relates to increasing the reliability of test results.

In recent years, rapid progress in miniaturization technologies in the semiconductor manufacturing process has lead to sudden advances in providing large scale and complex semiconductor integrated circuits. As a result, semiconductor integrated circuits have become even more difficult to test. In response this problem, design methods using a scan test technique or a Built-in Self Test (BIST) have been developed as solutions for simplifying the testing of semiconductor integrated circuits. The spread of these methods has allowed the effective testing of faults that are modeled by the stuck-at fault model.

In the case of detecting faults that are modeled by the stuck-at fault model, the ability to detect faults does not depend on the clock frequency, and thus a lower clock frequency than the operating clock frequency is generally used when executing a test according to a conventional scan test technique.

However, progress in the miniaturization of semiconductor devices has also led to increased malfunction in cases where the semiconductor device is run at a high clock frequency when the semiconductor integrated circuit is actually put into use (this is shortened to "during actual operation" hereinafter). This is because the use of a high clock frequency makes variations in the product quality of the semiconductor devices after the various manufacturing processes conspicuous. Such malfunctions dependant on the clock frequency cannot be adequately tested through conventional scan test techniques with low clock frequency, however, and thus a test employing the same clock frequency as during actual operation (for example, delay testing, BIST, etc.) is necessary in order to remedy this problem.

Delay testing is in general executed using a scan test technique, in which the two operating modes of shift operation mode and normal operation mode are executed together. To detect faults that are modeled by the stuck-at fault model, a single pulse can be input in the normal operation mode when a test employing a conventional scan test technique is executed. However, two pulses must be input in the normal operation mode in a delay test, and moreover, the clock frequency of these two pulses must be the same as the clock frequency during actual operation.

Also, in order to test for defects dependant on the clock frequency when executing a BIST, a pulse at the clock frequency that is employed when the semiconductor integrated circuit including the BIST circuit is in actual use must be input to the semiconductor integrated circuit.

Conventionally, in order to meet the above described requirements, a circuit (for example, a tester) that supplies a clock signal for testing at a constant clock frequency (test clock) was separately provided outside the semiconductor integrated circuit, even when the oscillation circuit (such as a PLL) employed during actual operation was provided inside the semiconductor integrated circuit. During testing, the pulses for testing were supplied externally by switching from the input of the oscillation circuit to the input of the tester using a selector, for example.

If the input from the test clock terminal is switched to in place of the pulse from the oscillation circuit using a selector or the like in order to perform a delay test or a BIST, then a tester capable of supplying a pulse at the clock frequency during actual operation is necessary if the pulses for testing are to be supplied externally (from a tester, for example) during the test.

For example, if the clock frequency of the semiconductor integrated circuit during actual operation is 1 GHz, then a high speed tester capable of supplying a 1 GHz clock frequency for testing is necessary if a delay test or a BIST, which use the same clock frequency as during actual operation, is performed with respect to the semiconductor integrated circuit. However, a high-speed tester that is capable of supplying a 1 GHz clock frequency is extremely expensive, and would lead to an increase in costs.

A conceivable solution to this problem is to utilize the pulse that is output from the oscillation circuit inside the semiconductor integrated circuit when a high clock frequency is required during testing. The phase of the pulse that is output from the oscillation circuit cannot be found externally, however, and thus there is a risk that the pulse that is output from the oscillation circuit will assume an unstable waveform if the oscillation circuit inside the semiconductor integrated circuit is employed to execute a delay test or a BIST without altering the conventional configuration of the semiconductor integrated circuit. Hereinafter, this problem is explained in reference to the drawings.

FIG. 23 is a circuit diagram showing a conventional semiconductor integrated circuit. As shown in FIG. 23, a semiconductor integrated circuit 2000 has a clock control portion 2005, which is provided with a test clock terminal 2001, a clock switching terminal 2002, a PLL 2003, and a selector 2004, and a test circuit 2008, which is provided with flip-flops 2006 and 2007.

FIGS. 24A and 24B are diagrams that show the signal waveform of each portion of the semiconductor integrated circuit 2000 when a delay test is executed to test the test circuit 2008. The waveforms shown in FIG. 24A and 24B are the signal waveforms of the PLL 2003, the test clock terminal 2001, the clock switching terminal 2002, and the selector 2004, respectively. Here, the clock frequency of the PLL 2003 is twice the clock frequency of the test clock terminal 2001. That is, the clock frequency of the test clock terminal 2001 is half the clock frequency of the PLL 2003.

First, if the conventional semiconductor integrated circuit 2000 is tested using a default test that employs a scan test technique, then, in the shift operation mode, the output signal of the clock switching terminal 2002 is switched to 1, and a pulse from the low speed test clock terminal 2001 is supplied to the test circuit 2008 (this corresponds to the period S1 in FIGS. 24A and 24B).

Next, a switch is made to the normal operation mode (this corresponds to the point S2 in FIGS. 24A and 24B). In the normal operation mode, the clock frequency during actual operation of the semiconductor integrated circuit 2000 is required. Accordingly, the clock switching terminal 2002 is switched to 0, and a clock signal from the PLL 2003 is supplied to the test circuit 2008 (this corresponds to the period S3 in FIGS. 24A and 24B). At this time there must be exactly two pulses supplied to the test circuit 2008. Consequently, the period during which the clock switching terminal 2002 is fixed at 0 is set to the time required for two pulses from the PLL 2003.

FIG. 24A shows a case where exactly two pulses are supplied to the test circuit 2008 during the normal operation mode. However, the phase of the clock signal that is output from the PLL 2003 cannot been known from the outside, and thus there is no guarantee that the operation will always be that shown in FIG. 24A.

FIG. 24B shows a case where the phase of the clock signal of the PLL 2003 is different from that shown in FIG. 24A, and in this case the number of pulses supplied during the normal operation mode is not exactly two. In FIG. 24B, the logical value of the signal output by the PLL 2003 is 1 at the instant that the logical value of the signal output by the clock switching terminal 2002 is switched from 1 to 0. For this reason, the logical value of the signal output by the selector 2004 changes from 0 to 1, and a narrow pulse P1 is generated. As a consequence, three pulses are generated during the normal operation mode, and moreover, the operation of the circuit (more specifically, the flip-flops 2006 and 2007) cannot be guaranteed unless the pulses have at least a predetermined pulse width. Consequently, a narrow pulse P1 like that shown in FIG. 24B can become a factor that causes the test circuit 2008 to malfunction. In other words, the reliability of the test results becomes extremely low.

Next, a case in which the conventional semiconductor integrated circuit 2000 is tested using a BIST is described with reference to FIG. 25. FIG. 25 is a diagram in which a BIST circuit has been provided in place of the test circuit 2008, and shows the signal waveform of each portion of the semiconductor integrated circuit 2000 when a BIST is executed. The reference numerals in FIG. 25 denote the same components as in FIG. 24, and the clock frequencies of the PLL 2003 and test clock terminal 2001 are also the same as in FIG. 24. It should be noted that here the clock switching terminal 2002 is employed to signal the start of the BIST test.

First, the logical value of the output signal of the test clock terminal 2001 is fixed at 0, and the logical value of the output signal of the clock switching terminal 2002 is switched from 1 to 0 (this corresponds to point B1 in FIGS. 25A and 25B). Consequently, the BIST circuit starts operating.

FIG. 25A shows a case in which the pulse supplied to the BIST circuit is normal. However, as was also the case with the delay test, the phase of the clock signal that is output from the PLL 2003 cannot be known from the outside, and thus there is no guarantee that its phase will always be that shown in FIG. 25A.

FIG. 25B shows a case in which the phase of the clock signal of the PLL 2003 is different from that shown in FIG. 25A and an abnormal pulse is included in the pulses that are supplied to the BIST circuit. As shown in FIG. 25B, the logical value of the signal that is output by the PLL 2003 is 1 in the instant (B1) that the logical value of the signal output by the clock switching terminal 2002 is switched from 1 to 0. Thus, the logical value of the signal that is output from the selector 2004 is changed from 0 to 1, and a narrow pulse P2 is generated. Unless the pulses have at least a predetermined pulse width, the operation of the circuit cannot be guaranteed. Consequently, the narrow pulse P2 that is shown in FIG. 25B can become a cause of BIST circuit malfunction. That is, there is a danger that the results of a test according to a BIST technique will be incorrect.

As described above, the conventional configuration is not suited for testing with a delay test or a BIST in which the oscillation circuit inside the semiconductor integrated circuit is used.

SUMMARY OF THE INVENTION

It is an object of the present invention to provide a semiconductor integrated circuit that is suitable for testing that requires a test clock with a high clock frequency, and a method of testing the same.

A semiconductor integrated circuit of the present invention is provided with a clock control portion having a clock generation portion for generating a clock signal and an output command signal input portion for receiving a clock output command signal from the outside, and an internal circuit controlled by an output clock signal that is output from the clock control portion, and the clock control portion is configured so that it outputs the output clock signal to the internal circuit when a certain time period has passed from a time when the output command signal is received.

According to the present invention, by adjusting the period from the time when the clock control portion receives the output command signal to when it outputs the output clock signal to the internal circuit, it is possible to reliably supply a fully shaped pulse output from the clock generation portion to the internal circuit at the clock frequency during actual operation of the semiconductor integrated circuit, to serve as the output clock signal that is output from the clock control portion.

It is preferable that the clock control portion is configured so as to output a signal of a constant logical value to the internal circuit after the output clock signal of a certain number of pulses has been output to the internal circuit.

Thus, the operation of the semiconductor integrated circuit can be stabilized in a case where the output clock signal that is output from the clock control portion is not required.

It is possible that the internal circuit is provided a test input data generation portion, a test end control portion, a test results analysis portion, and a tested circuit portion, and that the test input data generation portion, the test end control portion, and the test results analysis portion test the tested circuit portion by the output clock signal.

Thus, it is possible to execute a built-in self test (BIST).

It is preferable that the test end control portion is provided with a circuit for detecting the number of pulses of the output clock signal and with a stop signal output portion for outputting a stop signal to stop output of the output clock signal to the internal circuit when the number of pulses of the output clock signal reaches a certain number of pulses.

Thus, when a detector or the like for monitoring the stop signal is connected to the stop signal output portion, it can be known from the outside that the number of pulses of the output clock signal has reached a certain number of pulses. Consequently, the test results can be immediately analyzed after output of the output clock signal to the internal circuit is stopped.

It is preferable that the clock control portion has been connected so as to receive the stop signal that is fed back from the stop signal output portion, and is configured so as to output a signal of a constant logical value to the internal circuit when the stop signal has been output to the stop signal output portion.

Thus, when the number of pulses of the output clock signal reaches a certain number of pulses, then the clock control portion can automatically switch the signal that is output to the internal circuit from the output clock signal to a signal with a constant logical value. Consequently, the test results can be analyzed after the output of the output clock signal to the internal circuit is stopped, even if a detector or the like for monitoring the stop signal is not connected to the stop signal output portion.

It is preferable that the test end control portion is further provided with an end signal output portion for outputting an end signal to the outside in order to end the test, and that the output of the output clock signal from the clock control portion to the internal circuit and the readout of the results input to the test results analysis portion due to said output are performed in repetition, and once the number of repetitions has reached a certain number, that the test end control portion has been configured so as to output the end signal to the end signal output portion.

Thus, the output of the output clock signal from the clock control portion to the internal circuit and the readout of the results that are input to the test results analysis portion by the output can be performed so as to repeat automatically.

It is preferable that the test end control portion is provided with a register having a first numerical value input portion and with a stop signal output portion for outputting a stop signal to stop output of the output clock signal to the internal circuit, and that the stop signal is output by the stop signal output portion when the number of pulses of the clock signal output from the clock control portion matches a numerical value of the first numerical value input portion.

Thus, during a BIST, it is possible to set the number of pulses of the output clock signal, which is output from the clock control portion to the internal circuit, to a value that has been freely input to the register.

It is preferable that the test end control portion is further provided with an end signal output portion for outputting an end signal to the outside and that the register is further provided with a second numerical value input portion and a third numerical value input portion that is capable of inputting an arbitrary numerical value from the outside, wherein an output of the output clock signal from the clock control portion to the internal circuit, a readout of the results input to the test results analysis portion due to said output, and an output of the stop signal from the test end control portion to the stop signal output portion when the number of pulses required for said readout matches the numerical value of the second numerical value input portion are repeated, and the test end control portion is configured such that it outputs a test end signal to the end signal output portion when the number of repetitions of the output of the output clock signal, the readout, and the output of the stop signal matches the numerical value of the third numerical value input portion.

Thus, the number of pulses that is required to read out the results input to the test results analysis portion can be set to the value that is input to the register, and the number of times to repeat the output of the output clock signal, the readout, and the output of the stop signal can be set to any number.

It is also possible that any numerical value can be input into the first numerical value input portion and the second numerical value input portion from the outside.

It is also possible that the first numerical value input portion, the second numerical value input portion, and the third numerical value input portion constitute a scan chain through which numerical values are input.

It is preferable that the test results analysis portion has a test results register for storing actually observed values of the test results of the tested circuit portion, an expected value register for storing expected values of the test results of the tested circuit portion, and a comparator portion for comparing the actually observed values of the test results with the expected values of the test results.

Thus, by determining the number of pulses, the time required to read out the test results, and the number of repetitions in advance, they can be freely set and the analysis of the test results can be automated. Also, the built-in self test can be executed while the outcome of whether the test results show the existence of a fault is output.

The test results register can be provided with a function for outputting the actually observed values of the test results of the tested circuit portion one bit at a time, and the comparator portion performs a comparison one bit at a time.

Thus, faults can be determined easily with a relatively small circuit configuration.

The comparator portion can also be provided with a function for grouping the actually observed values that are output from the test results register and the expected values that are output from the expected value register and comparing them in response to an input of a single pulse clock signal.

Thus, the time required for determining faults can be shortened.

A method of testing a semiconductor integrated circuit according to the present invention is a method of testing a semiconductor integrated circuit that is provided with a clock control portion having a clock generation portion for generating a clock signal and an output command signal input portion for receiving an output command signal from the outside and an internal circuit controlled by an output clock signal that is output from the clock control portion, the semiconductor integrated circuit being configured such that the output clock signal is output to the internal circuit when a certain time period has passed from a time when the output command signal is received, wherein after said time, the internal circuit is tested by a scan technique using the output clock signal.

According to the present invention, by adjusting the period from the time when the clock control portion receives the output command signal to when it outputs the output clock signal to the internal circuit, it is possible to reliably supply a fully shaped pulse output from the clock generation portion to the internal circuit at the clock frequency during actual operation of the semiconductor integrated circuit to serve as the output clock signal that is output from the clock control portion, and thus a pulse of the frequency during actual operation, which is required for the normal operation mode, can be employed when malfunctions due to the clock frequency are tested using a scan technique.

It is also possible that the clock control portion further includes a test clock signal input portion for receiving a test clock signal from the outside, and that the test of the semiconductor integrated circuit using a scan technique is a delay test that uses a scan technique, wherein the clock control portion outputs the test clock signal to the internal circuit as the output clock signal prior to said time.

The output command signal can be the rise or the fall of a logical value.

The output command signal can be maintained at a constant logical value.

A method of testing a semiconductor integrated circuit according to the present invention is a method of testing a semiconductor integrated circuit that is provided with a clock control portion having a clock generation portion for generating a clock signal and an output command signal input portion for receiving an output command signal from the outside and with an internal circuit having a test input data generation portion, a test end control portion, a test results analysis portion, and a tested circuit portion, and which is controlled by an output clock signal that is output from the clock control portion, and the test input data generation portion, the test end control portion, and the test results analysis portion of the internal circuit are configured so as to use the output clock signal to test the tested circuit portion, wherein the method includes a step (a) of establishing a number of pulses of the output clock signal output by the clock control portion to the internal circuit from a time when the output command signal is received, a step (b)

in which the clock control portion outputs the output clock signal to the internal circuit when a certain time period has passed from said time when the output command signal is received, and a step (c) of reading out test results from the test results analysis portion after the input of the output clock signal with the number of pulses established in step (a) is complete.

According to the present invention, by adjusting the period from the time when the clock control portion receives the output command signal to when it outputs the output clock signal to the internal circuit, it is possible to reliably supply a fully shaped pulse output from the clock generation portion to the internal circuit at the clock frequency during actual operation of the semiconductor integrated circuit to serve as the output clock signal that is output from the clock control portion, and thus a pulse at the frequency during actual operation, which is required in a case where malfunctions due to the clock frequency are tested with a built-in self test (BIST), can be employed.

A method of testing a semiconductor integrated circuit according to the present invention is a method of testing a semiconductor integrated circuit that is provided with a clock control portion having a clock generation portion for generating a clock signal and an output command signal input portion for receiving an output command signal from the outside and with an internal circuit having a test input data generation portion, a test end control portion having an end signal output portion, a test results analysis portion, and a tested circuit portion, and which is controlled by an output clock signal that is output from the clock control portion, and the test input data generation portion, the test end control portion, and the test results analysis portion of the internal circuit test the tested circuit portion by the output clock signal, wherein the method includes a step (a) of establishing a number of pulses of the output clock signal output to the internal circuit by the clock control portion from a time when the output command signal is received, a step (b) in which the clock control portion outputs the output clock signal to the internal circuit when a certain time period has passed from said time when the output command signal is received, a step (c) in which the test end control portion outputs an end signal for ending the test to the end signal output portion when the input of the output clock signal with the number of pulses established in step (a) is complete, and a step (d) of reading out test results from the test results analysis portion, which receives the end signal.

Thus, the time required for determining faults can be shortened.

A method of testing a semiconductor integrated circuit according to the present invention is a method of testing a semiconductor integrated circuit that is provided with a clock control portion having a clock generation portion for generating a clock signal and an output command signal input portion for receiving an output command signal from the outside, and with an internal circuit having a test input data generation portion, a test end control portion, a test results analysis portion, and a tested circuit portion, and which is controlled by an output clock signal that is output from the clock control portion, wherein the test input data generation portion, the test end control portion, and the test results analysis portion of the internal circuit test the tested circuit portion by the output clock signal, and the method includes a step (a) in which the clock control portion outputs the output clock signal to the internal circuit when a certain period of time has passed from a time when the output command signal is received, and a step (b) of reading out results input to the test results analysis portion, wherein step (a) and step (b) are repeated.

Thus, by repeatedly performing the built-in self test it is possible to increase the precision of the fault diagnosis.

A method of testing a semiconductor integrated circuit according to the present invention is a method of testing a semiconductor integrated circuit that is provided with a clock control portion having a clock generation portion for generating a clock signal and an output command signal input portion for receiving an output command signal from the outside, and with an internal circuit having a test input data generation portion, a test end control portion that is provided with a register having a numerical value input portion and with a stop signal output portion, a test results analysis portion, and a tested circuit portion, and which is controlled by an output clock signal that is output from the clock control portion, wherein the test input data generation portion, the test end control portion, and the test results analysis portion of the internal circuit test the tested circuit portion by the output clock signal, the method including a step (a) in which the clock control portion inputs, to the numerical value input portion, a number of pulses of the output clock signal that is output to the internal circuit from the time when the output command signal is received, a step (b) in which the clock control portion outputs the output clock signal to the internal circuit when a certain time period has passed from said time when the output command signal is received, a step (c) of outputting, to the stop signal output portion, a stop signal for stopping output of the output clock signal to the internal circuit when the number of pulses of the clock signal that is output from the clock control portion matches a numerical value of the numerical value input portion, and a step (d) of reading out test results from the test results analysis portion, wherein steps (a) to (d) are repeated with the next step (a) executed simultaneous to step (d).

By starting the subsequent step in which the clock control portion inputs the number of pulses of the output clock signal that is output to the internal circuit to the numerical value input portion at the same time when the test results are read out, it is possible to shorten the time required for the test.

A method of testing a semiconductor integrated circuit according to the present invention is a method of testing a semiconductor integrated circuit that is provided with a clock control portion having a clock generation portion for generating a clock signal and an output command signal input portion for receiving an output command signal from the outside, and with an internal circuit having a test input data generation portion, a test end control portion, a test results analysis portion, and a tested circuit portion, and which is controlled by an output clock signal that is output from the clock control portion, wherein the test input data generation portion, the test end control portion, and the test results analysis portion of the internal circuit test the tested circuit portion by the output clock signal, the method including a step (a) in which the clock control portion outputs the output clock signal to the internal circuit when a certain time period has passed from a time when the output command signal is received, a step (b) of reading out results input to the test results analysis portion through step (a), and a step (c) of repeating step (a) and step (b) and ending the test of the semiconductor integrated circuit at a point where a fault is confirmed in the results that are read out in step (b).

By ending the test of the semiconductor integrated circuit at the point that a fault is confirmed in the test results that are read out, it is possible to shorten the testing time.

A method of testing a semiconductor integrated circuit according to the present invention is a method of testing a semiconductor integrated circuit that is provided with a clock control portion having a clock generation portion for generating a clock signal and an output command signal input portion for receiving an output command signal from the outside, and with an internal circuit having a test input data generation portion, a test end control portion that is provided with an end signal output portion, a test results analysis portion, and a tested circuit portion, and which is controlled by an output clock signal that is output from the clock control portion, wherein the test input data generation portion, the test end control portion, and the test results analysis portion of the internal circuit test the tested circuit portion by the output clock signal, the method including a step (a) in which the clock control portion outputs the output clock signal to the internal circuit when a certain time period has passed from a time when the output command signal is received, a step (b) of reading out results input to the test results analysis portion, and a step (c) of repeating step (a) and step (b), and when a number of the repetitions has reached a certain number, of performing a fault diagnosis based on the results read out in step (b) after the test end control portion has output an end signal to the end signal output portion.

By repeatedly executing the test even after a fault has been confirmed in the results that are read out, it is possible to obtain information for specifying the location of faults in the circuit from the test results that are obtained.

BRIEF DESCRIPTION OF THE DRAWINGS

FIGS. 9A and 9B are diagrams showing the signal waveforms of the various terminals of the semiconductor integrated circuit when a delay test is executed.

FIGS. 15A and 15B are diagrams showing the signal waveforms of the various terminals of the semiconductor integrated circuit when a BIST is executed.

DETAILED DESCRIPTION OF THE INVENTION

Figure 1:
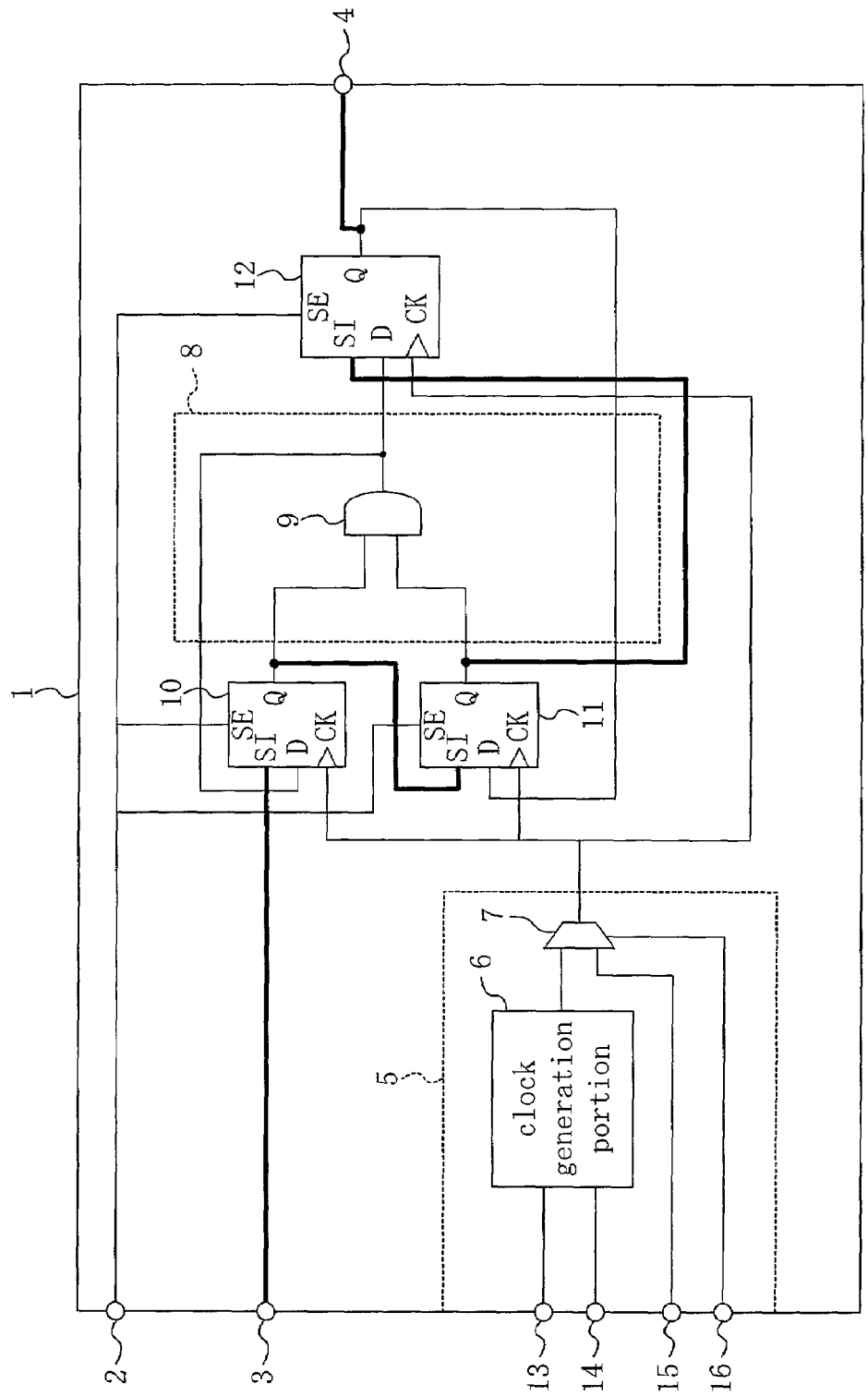
FIG. 1 is a circuit diagram of a semiconductor integrated circuit.

Hereinafter, embodiments of the present invention will be described with reference to the drawings. For the sake of simplicity, structural elements that are common to each of the embodiments are denoted by identical reference numerals.

Embodiment 1

First, the configuration of the semiconductor integrated circuit of this embodiment is described.

FIG. 1 is a circuit diagram of the semiconductor integrated circuit of this embodiment. A semiconductor integrated circuit 1 is provided with a scan-enable terminal 2, a scan-in terminal 3, a scan-out terminal 4, a clock control portion 5, a combinational circuit portion 8, and scan flip-flops 10, 11, and 12. Also, the scan-in terminal 3, the scan flip-flop 10, the scan flip-flop 11, the scan flip-flop 12, and the scan-out terminal 4 are connected in that order to form a scan chain.

In this embodiment, the combinational circuit portion 8 is constituted only by an AND gate 9.

As shown in FIG. 1, the scan flip-flops 10, 11, and 12 are each provided with a scan-enable terminal SE, a scan-in terminal SI, a clock input terminal CK, a data input terminal D, and an output terminal Q. The scan-enable terminals SE of the scan flip-flops 10, 11, and 12 are connected to the scan-enable terminal 2. The clock input terminals CK of the scan flip-flops 10, 11, and 12 are connected to the clock control portion 5. The output terminals Q of the scan flip-flops 10 and 11 are connected to the input side of the combinational circuit portion 8. The data input terminals D of the scan flip-flops 10 and 12 are connected to the output side of the combinational circuit portion 8. The data input terminals D of the scan flip-flops 11 and 12 are connected to the output terminal Q of the scan flip-flop 12.

Figure 3:
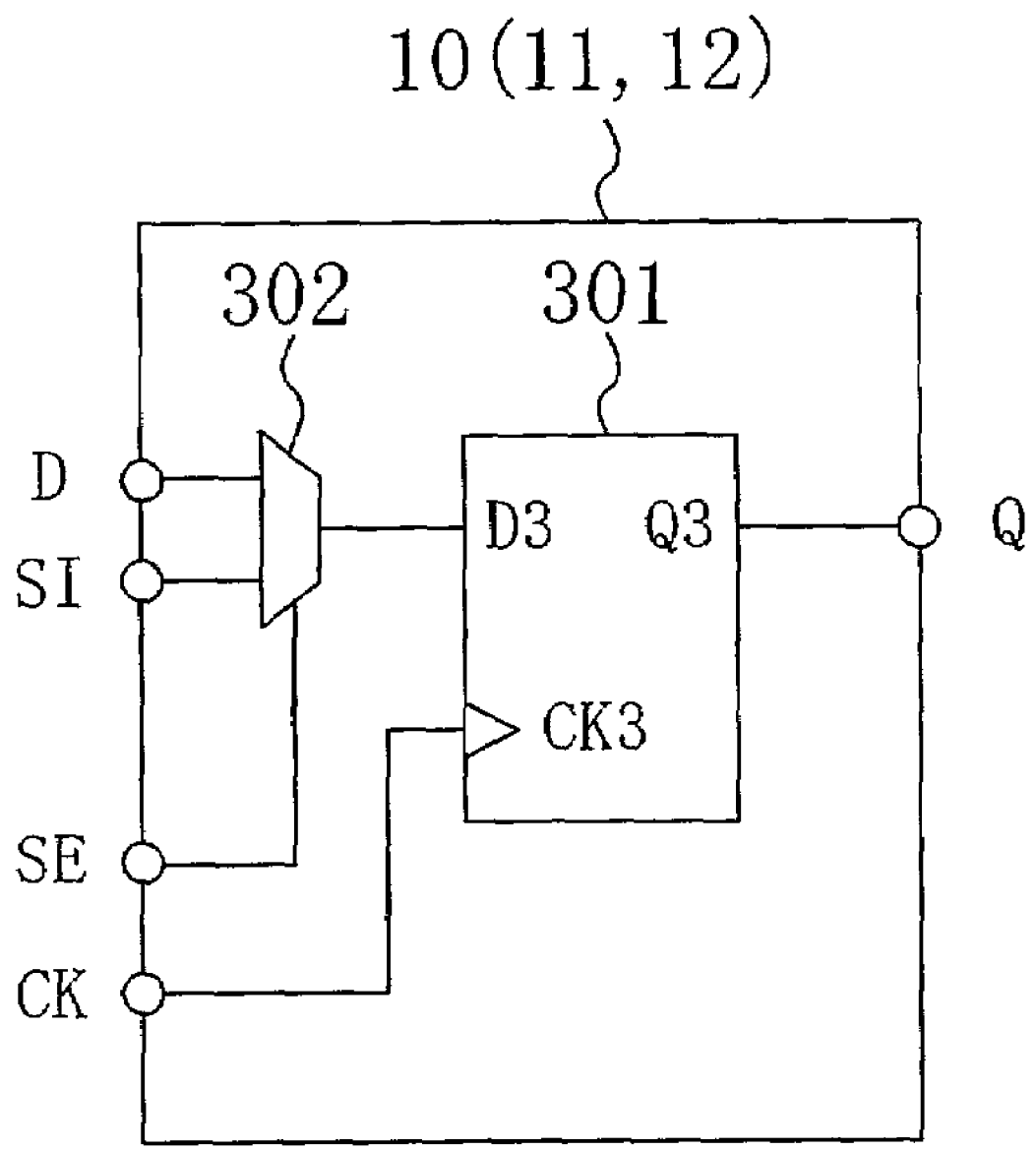
FIG. 3 is a circuit diagram showing the internal configuration of the scan flip-flops in FIG. 1.

FIG. 3 is a circuit diagram showing the internal configuration of the scan flip-flops 10, 11, and 12 of FIG. 1. The scan flip-flops 10, 11, and 12 are provided with a selector 302 and a flip-flop 301, which is provided with a clock input terminal CK3, a data terminal D3, and an output terminal Q3. The data terminal D3 of the flip-flop 301 is connected to the selector 302. The output terminal Q3 of the flip-flop 301 is connected to the output terminal Q of the scan flip-flop 10 (11, 12). The clock input terminal CK3 of the flip-flop 301 is connected to the clock input terminal CK of the scan flip-flop 10 (11, 12). The selector 302 is connected to the scan-enable terminal SE, the scan-in terminal SI, and the data terminal D of the scan flip-flop 10 (11, 12).

The flip-flop 301 obtains the logical value of the signal that is given to its data terminal D3 in synchronization with the clock signal given to its clock input terminal CK3, and outputs the obtained value to its output terminal Q3. The selector 302 selects the signal of the data terminal D if the logical value of the signal of the scan-enable terminal SE is 0 (normal operation mode), and selects the signal of the scan-in terminal SI if the logical value of the signal of the scan-enable terminal SE is 1 (shift operation mode).

Figure 2:
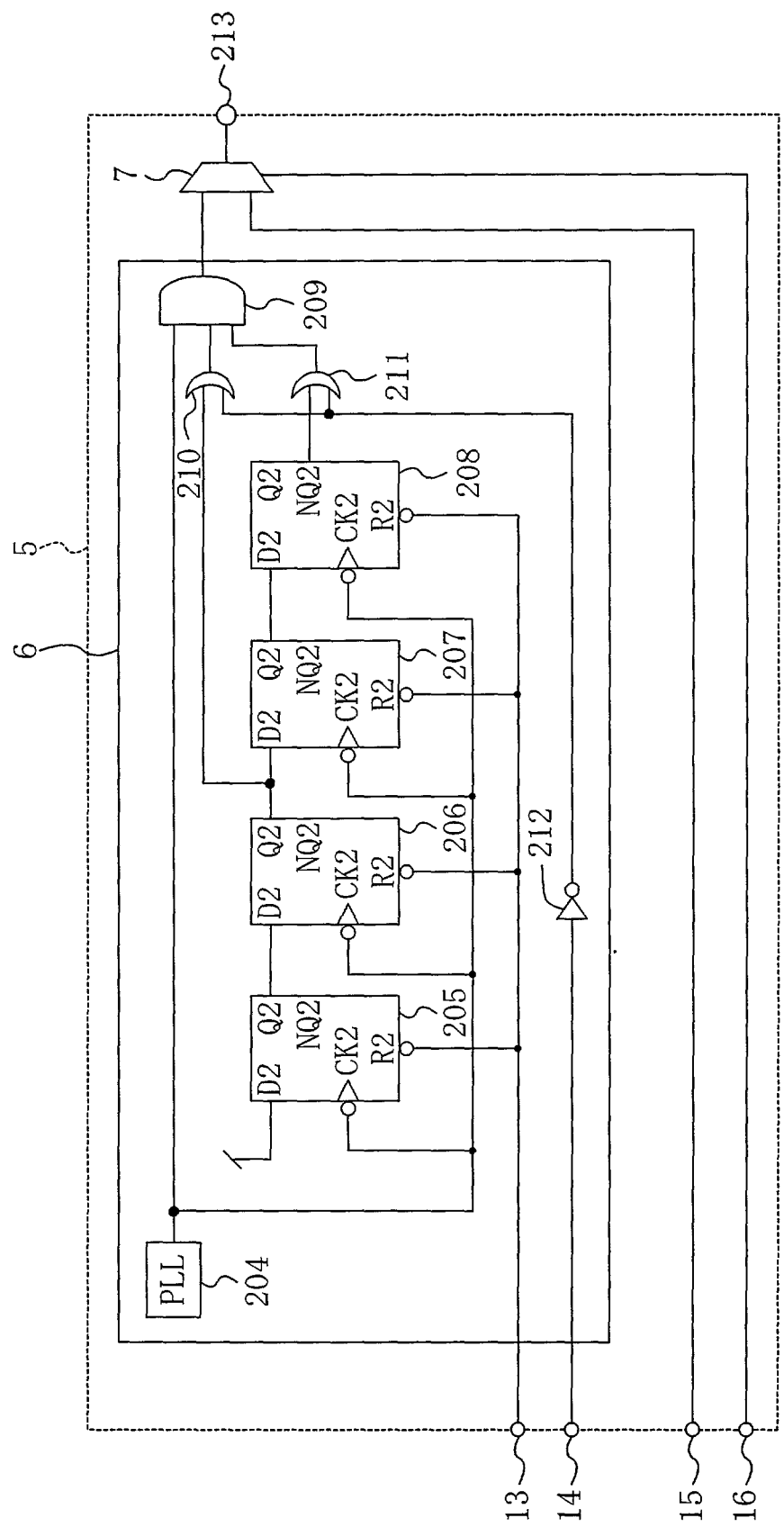
FIG. 2 shows a more detailed circuit diagram of the clock control portion and the clock generation portion shown in FIG. 1.

As shown in FIG. 1, the clock control portion 5 is provided with a clock generation portion 6, a selector 7, a clock control terminal 13, a test mode terminal 14, a test clock terminal 15, and a clock switching terminal 16. FIG. 2 shows a more detailed circuit diagram of the clock control portion 5 and the clock generation portion 6 shown in FIG. 1. As shown in FIG. 2, the clock generation portion 6 is provided with a PLL 204, flip-flops 205, 206, 207, and 208, an AND gate 209, OR gates 210 and 211, and an inverter 212.

The PLL 204 is connected to the AND gate 209 and the clock input terminals CK2 of the flip-flops 205 to 208.

The flip-flops 205, 206, 207, and 208 are arranged in series and are connected to one another via their data terminals D2 and output terminals Q2. However, the data terminal D2 of the flip-flop 205 is connected only to the power source, and the output terminal Q2 of the flip-flop 206 branches to connect to the OR gate 210. Also, the output terminal Q2 of the flip-flop 208 is not connected to anything, and the negative output terminal NQ2 of the flip-flop 208 is connected to the OR gate 211. The reset terminals R2 of the flip-flops 205, 206, 207, and 208 are connected to the clock control terminal 13.

The input side of the inverter 212 is connected to the test mode terminal 14, and the output side of the inverter 212 is connected to the OR gates 210 and 211.

The input side of the AND gate 209 is connected to the PLL 204 and the OR gates 210 and 211, and the output side of the AND gate 209 is connected to the selector 7.

The input side of the selector 7 is connected to the AND gate 209, the test clock terminal 15, and the clock switching terminal 16, and the output side of the selector 7 is connected to the output terminal 213.

The flip-flops 205, 206, 207, and 208 obtain the logical value of the signal that is given to their data terminals D2 and output this value from their output terminals Q2 in synchronization with a falling signal input to their clock input terminals CK2. They also output the inverse value of their output terminals Q2 from their output terminals NQ2. When 0 is input to their reset terminals R2, they output a value 0 signal from their output terminal Q2 asynchronous to the clock signal that is input to their clock input terminal CK2. It should be noted that the data terminal D2 of the flip-flop 205 is connected to the power source, and thus a value of 1 is always input to its data terminal D2.

A method of testing the semiconductor integrated circuit 1 is described next. In this embodiment, a method of testing the semiconductor integrated circuit 1 in which a tester is employed that supplies a test clock at a lower clock frequency than the operating clock frequency of the semiconductor integrated circuit 1 is described. The following is a description of a delay test with regard to a transition from 1 to 0 on the signal path (Q terminal of the scan flip-flop 11→AND gate 9→D terminal of scan flip-flop 12) in the semiconductor integrated circuit 1 and at the starting point of the signal path (Q terminal of scan flip-flop 11). In the present embodiment, a delay test employing a scan technique is performed, but the present invention is not limited to this, and a general test employing a scan technique can also be adopted.

Figure 4:
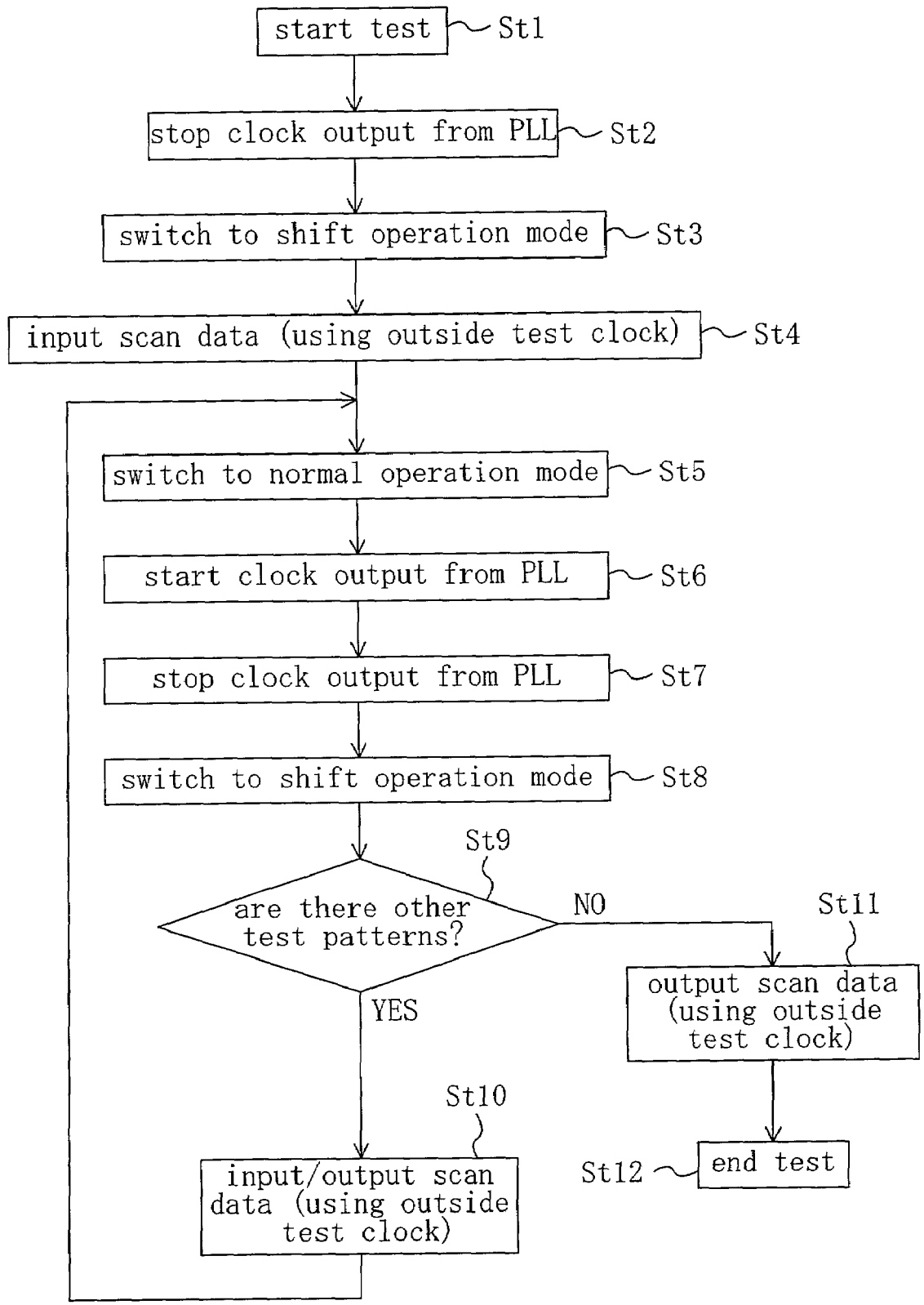
FIG. 4 is a flow chart showing a delay test.

FIG. 4 is a flow chart showing a delay test in which the semiconductor integrated circuit 1 of this embodiment is the tested object. FIG. 5 is a diagram showing the signal waveforms of the terminals of the semiconductor integrated circuit 1 when a delay test is performed with the semiconductor integrated circuit 1 of FIG. 1 serving as the object that is tested. It should be noted that the reference numerals in FIG. 5 correspond to the reference numerals shown in FIGS. 1 and 2. In the present embodiment, the clock frequency of the PLL 204 is two times the clock frequency of the test clock terminal 15. That is, the clock frequency of the test clock terminal 15 is half the clock frequency of the PLL 204.

First, as shown in FIG. 4, the test is started at step St1. More specifically, in a case where a delay test that uses scan testing is executed with respect to the semiconductor integrated circuit 1, the logical value of the signal of the test mode terminal 14 is set to 1. This signal is always fixed at 1 during the test. This value can be converted to 0 by the inverter 212, with the effect that the logical value of the signals that are output from the OR gates 210 and 211 is always 0.

As shown in FIG. 4, once the test has been started, in step St2 the clock signal of the PLL is kept from being output. More specifically, the logical value of the signal that is input to the clock control terminal 13 is set to 0. At this time, the logical value of the signals that are output from the output terminals Q2 of the flip-flops 205, 206, 207, and 208 is 0 in all cases (conversely, the logical value of the signal of the output terminals NQ is 1 in all cases). For this reason, the output of the AND gate 209 is fixed at 0, or in other words, the clock signal of the PLL 204 is not output from the selector 7.

Next, as shown in FIG. 4, in step St3, a switch is made to the shift operation mode. More specifically, when the switch is made to the shift operation mode, the logical value of the signals that are input to the scan-enable terminal 2 and the clock switching terminal 16 is set to 1. In particular, in the present embodiment, the scan-enable terminal 2 and the clock switching terminal 16 perform the same operation, which lets the selector 7 select the test clock terminal 15. As a result, the clock signal that is supplied from the tester by way of the test clock terminal 15 is output from the clock control portion 5. Also, the scan flip-flops 10 to 12 select the logical value of the signal that is input to their SI terminals.

Next, as shown in FIG. 4, in step St4, scan-in data are input using the test clock signal from the test clock terminal 15. Step St4 corresponds to the period T1 in FIG. 5. More specifically, when scan data are input from the scan-in terminal 3 in the order of, for example, 0, 1, 1, in synchronization with the clock signal of the test clock terminal 15, then the data are set in the order of the scan flip-flops 12, 11, and 10, respectively. The logical value of all signals on the signal path (Q terminal of the scan flip-flop 11→AND gate 9 →D terminal of the scan flip-flop 12) is 1 at this time.

Next, as shown in FIG. 4, in step St5, the test is switched to the normal operation mode. Step St5 corresponds to the point T2 shown in FIG. 5. More specifically, the logical value of the signal that is input to the scan-enable terminal 2 and the clock switching terminal 16 after the scan data are input is set to 0. By this operation, the selector 7 selects the signal that is output from the clock generation portion 6.

Also, the scan flip-flops 10 to 12 select the logical value of the signal of their data terminals D. Thus, the semiconductor integrated circuit 1 performs the same operation (normal operation) as during actual operation.

Concurrent to the above operation, the logical value of the signal that is input to the clock control terminal 13 is switched to 1. Consequently, as shown in FIG. 4, in step St6, the output of the clock signal of the PLL 204 from the selector 7 is started. Step St6 corresponds to the period T3 of FIG. 5. The operation of the clock generation portion 6 during step St6 is described more specifically below.

First, when the logical value of the signal that is input to the clock control terminal 13 is 0, then a signal with a logical value of 0 is output from the output terminals Q2 of the flip-flops 205 to 208. When the logical value of the signal that is input to the clock control terminal 13 is switched to 1, the flip-flops 205 to 208 obtain the logical value of the signal that is given to their data terminals D2 in synchronization with the falling signal input to their clock input terminals CK2, and output this value from their output terminals Q2. Because the logical value of the signal at the data terminal D2 of the flip-flop 205 is always fixed at 1, the flip-flop 205 outputs a signal with a logical value of 1 from its output terminal Q2 in synchronization with the fall of signal that is input to its clock input terminal CK2.

Next, the flip-flops 206, 207, and 208 obtain the logical value of the signal that is given to their data terminals D2 in synchronization with the falling signal that is input to their clock input terminals CK2. The value that is obtained is then output to their output terminals Q2. Thus, a signal with a logical value of 1 is delivered to the flip-flops 205, 206, 207, and 208 in that order at each fall of the clock signal of the PLL 204 that is input to their clock input terminals CK2.

The output terminal Q2 of the flip-flop 206 is connected to the AND gate 209 via the OR gate 210. Thus, the result of the above operation is that the clock generation portion 6, as shown by the period T3 of FIG. 5, counts from the point (T2) at which the logical value of the signal that is input to the clock control terminal 13 is switched to 1 and starts outputting the clock signal of the PLL 204 from the AND gate 209 immediately after the second fall of the pulse that is output from the PLL 204.

Next, as shown in FIG. 4, in step St7, the clock output from the selector 7 is stopped. The output terminal NQ2 of the flip-flop 208 is connected to the AND gate 209 via the OR gate 211. Thus, as shown by the period T3 in FIG. 5, the flip-flop 208 counts from the point (T2) at which the logical value of the signal that is input to the clock control terminal 13 is switched to 1 and outputs a signal with a logical value of 0 from its output terminal NQ2 immediately after the fourth fall of the pulse that is output from the PLL 204, so as to once again fix the logical value of the output signal of the AND gate 209 to 0. By once again fixing the logical value of the output signal of the AND gate 209 to 0, it is possible to remove pulses of the output clock signal that are not necessary during testing, and thus the operation of the semiconductor integrated circuit can be stabilized. As is clear from the above-mentioned operation of step St6 and step St7, in the period T3 of FIG. 5, the logical value of the signals in the clock control terminal 13, the clock switching terminal 16, and the scan-enable terminal 2 (respectively 1, 0, 0) must stay constant for a period of a minimum of four pulses of the clock signal of the PLL 204.

Due to the operation of the above steps St6 and St7, the clock generation portion 6 outputs two pulses of the clock signal generated by the PLL 204 during the period of the normal operation mode. Of these, as a result of the first pulse, the logical values of the signals in the scan flip-flops 12, 11, and 10 become 1, 0, 1, respectively, and there is a transition in the logical value of the signal on the signal path (Q terminal of the scan flip-flop 11→AND gate 9→D terminal of the scan flip-flop 12) from 1 to 0. Then, as a result of the second pulse, the logical value of the signal that is changed by the transition on the signal path (Q terminal of the scan flip-flop 11→AND gate 9→D terminal of the scan flip-flop 12) is obtained by the scan flip-flop 12. At this time, the scan flip-flop 12 obtains a value of 0 if the circuit is normal and 1 if the circuit is defective.

Next, as shown in FIG. 4, in step St8 the test is switched to the shift operation mode. Step St8 corresponds to the point T4 shown in FIG. 5. More specifically, in order to output the test results obtained by the scan flip-flops 10 to 12 to the outside through a scan out operation, the logical value of the signal input to the clock control terminal 13 is set to 0 and the logical value of the signal input to the scan-enable terminal 2 and the clock switching terminal 16 is set to 1, as is also the case with the scan-in operation. As a result of this operation, the selector 7 selects the test clock terminal 15.

Next, the logical values of the signals held by the scan flip-flops 10 to 12 are sequentially output from the scan-out terminal 4 in response to the test clock signal that is supplied from the test clock terminal 15. Of these values, the logical value of the signal of the scan flip-flop 12 is observed at the scan-out terminal 4.

Next, as shown in FIG. 4, in step St9, it is determined whether there are still other test patterns to be input.

If it is determined in step St9 that other patterns still remain to be input, then the procedure advances to step St10 as shown in FIG. 4. In step St10, scan-in data are input from the scan-in terminal 3 in response to the test clock signal from the test clock terminal 15. That is, the procedure returns to step St5. Concurrent to the input of the scan-in data, the test results are scanned out from the scan-out terminal 4 to check whether there are defects in the circuit.

Next, in step St9, if there are no other test patterns to be input, then the procedure advances to step St11, as shown in FIG. 4. In step St11, the test clock signal from the test clock terminal 15 is employed to scan out the test results from the scan-out terminal 4 in order to check whether there are faults in the circuit.

Then, the test is ended at step St12 only after step St11 has been performed, as shown in FIG. 4.

Through the aforementioned operation of step St1 to step St12, a delay test can be executed for a transition from 1 to 0 of the logical value of the signal on the signal path (Q terminal of the scan flip-flop 11→AND gate 9→D terminal of the scan flip-flop 12) and at the starting point of the signal path (Q terminal of scan flip-flop 11). In particular, with the present embodiment, the two pulses that are output by the PLL 204 in the normal operation mode are the same frequency as during actual operation. This makes it possible to test for the existence of delay faults on the signal path (Q terminal of the scan flip-flop 11→AND gate 9→D terminal of the scan flip-flop 12) during actual operation. In other words, by restricting the number of pulses of the clock signal that is output from the PLL 204, it is possible to execute a delay test without the use of a high-speed tester.

Figure 5A:
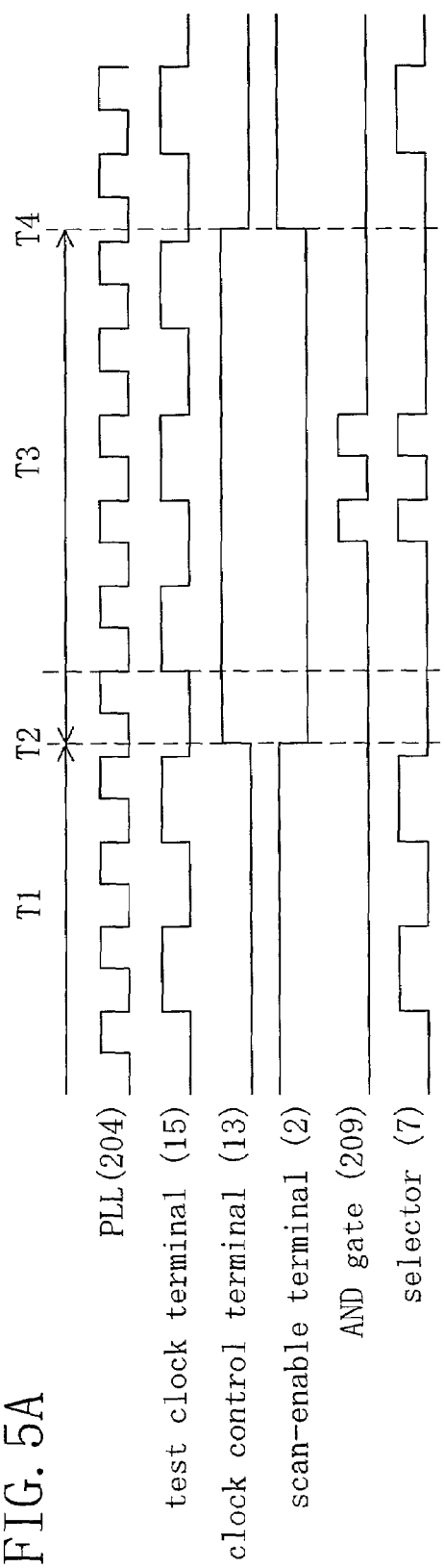
FIGS. 5A and 5B are diagram showing the signal waveforms of the various terminals of the semiconductor integrated circuit when a delay test is executed.

FIG. 5 shows the waveform of the signals from the terminals of the semiconductor integrated circuit 1 when this delay test is executed. FIG. 5A is a diagram showing a case where the clock control terminal 13 and the scan-enable terminal 2 (and the clock switching terminal 16) switch from the shift operation mode to the normal operation mode when the logical value of the clock signal of the PLL 204 is 0. FIG.

5B is a diagram showing a case where they switch from the shift operation mode to the normal operation mode when the logical value of the clock signal of the PLL 204 is 1.

Figure 5B:
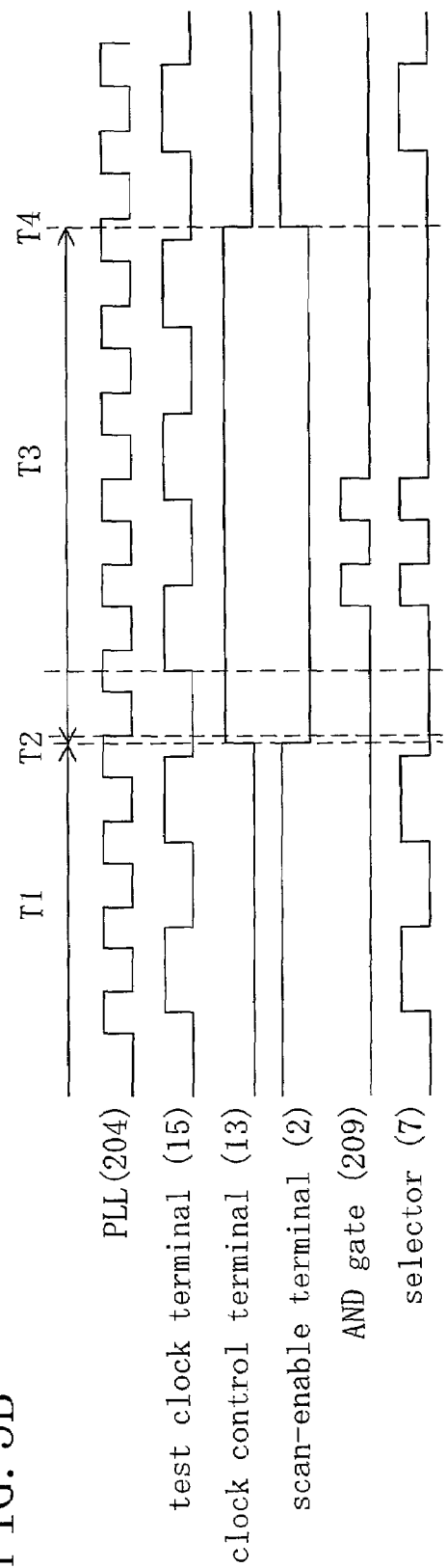
Figure 24A:
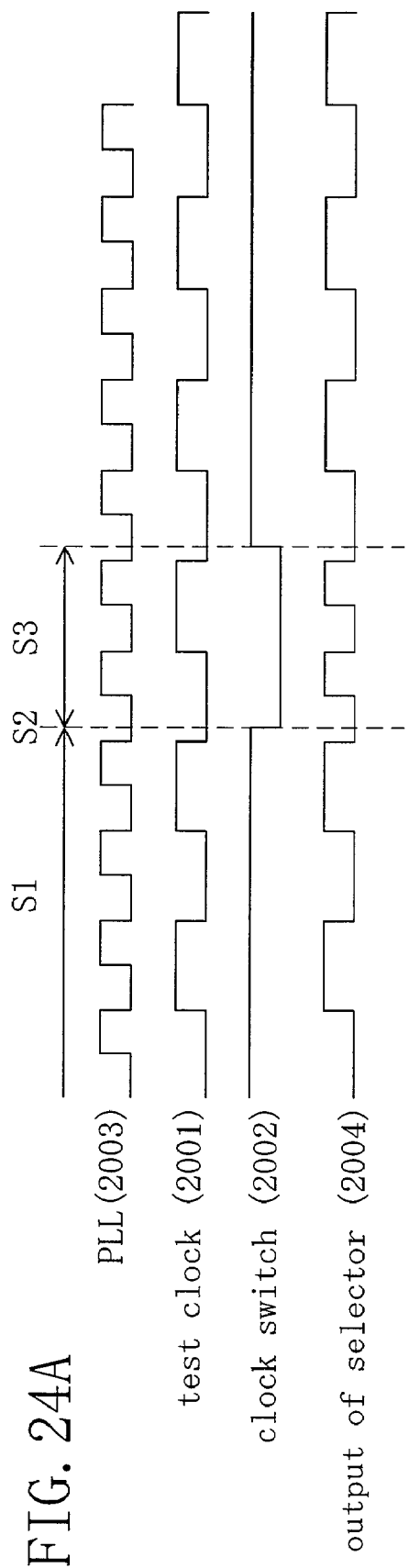
FIG. 24A and FIG. 24B are diagrams showing the signal waveform of the various portions of the conventional semiconductor integrated circuit when a delay test is executed.
Figure 24B:
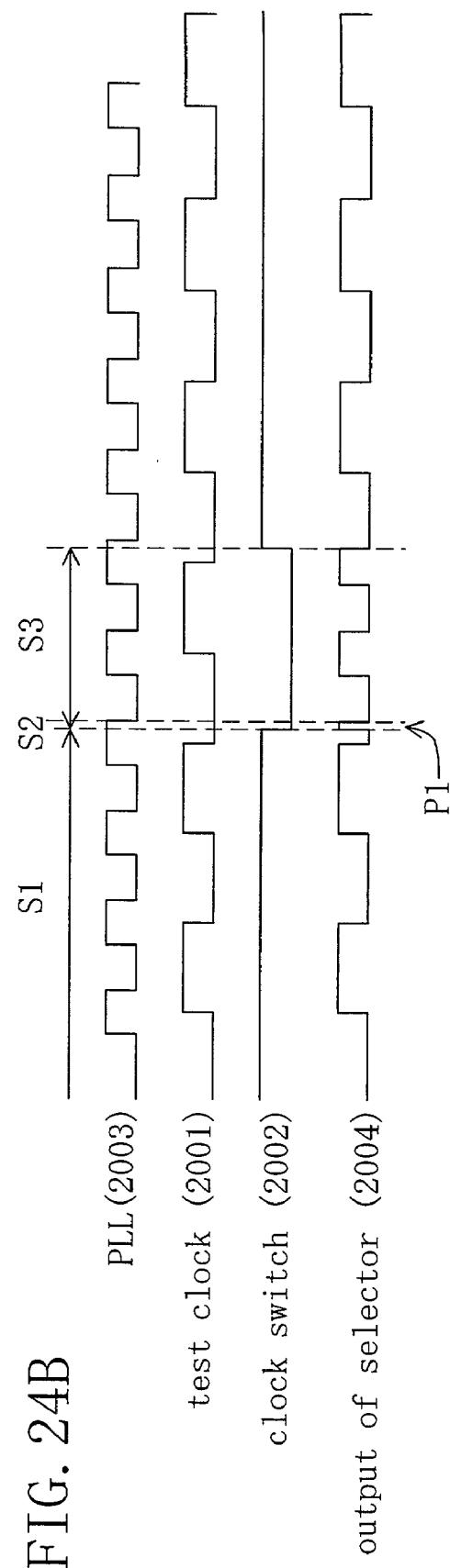

In the operation of the conventional configuration that is shown in FIG. 24B, which is the same as the state of FIG. 5B (when the clock control terminal 13 switches from 0 to 1, the subsequent time interval (LAG width in the diagram) until the initial fall of the clock that is output from the PLL 204 is very short), three pulses, including the very narrow pulse P1, are supplied into the circuit. In contrast, with the configuration of the present embodiment, exactly two fully shaped pulses are output from the PLL 204 and supplied to the combinational circuit portion 8 in both the case of FIG. 5A and 5B.

Consequently, in a delay test, the PLL 204 of the semiconductor integrated circuit 1 can be employed to use pulses with the frequency during actual operation, which is required for the normal operation mode, and thus a high-speed tester is not necessary.

Moreover, in the shift operation mode, it is possible to use a low-speed clock supplied from a tester, and thus a delay test that used a scan technique can be executed without the use of a high-speed tester.

It should be noted that the case described in the present embodiment is one in which two pulses are supplied to the combinational circuit portion 8 in the normal operation mode, but it is also possible to set the number of pulses that are supplied to the combinational circuit portion 8 in the normal operation mode to three by providing an additional flip-flop configured identical to the flip-flop 207 in series between the flip-flop 207 and the flip-flop 208. Thus, the present embodiment is also applicable for a delay test that requires three pulses in the normal operation mode. Also, by adjusting the number of flip-flops that are added in series between the flip-flops 207 and 208, the number of pulses that are input in the normal operation mode can be adjusted freely. In other words, it is possible to provide flip-flops identical to the flip-flop 207 in series between the flip-flop 207 and the flip-flop 208 in correspondence with the number of pulses to be supplied to the combinational circuit portion 8 in the normal operation mode.

Furthermore, it is possible to adjust the timing up to the point where the clock of the PLL 204 starts being output from the AND gate 209 after the logical value of the signal in the clock control terminal 13 is changed from 1 to 0, so as to correspond to any number of pulses from the PLL 204, by adding any number of flip-flops with the same structure as the flip-flop 206 in series between the flip-flop 205 and the flip-flop 206. The timing up to the point where the clock of the PLL 204 starts being output from the AND gate 209 must be set to after the first fall of the pulse output from the PLL 204 counting from the point (T2) at which the logical value of the signal that is input to the clock control terminal 13 is switched to 1 (that is, delayed one pulse), but in order to maintain the high reliability of the results of the delay test, the timing is preferably set to immediately after the second fall of the pulse output from the PLL 204.

Embodiment 2

Figure 6:
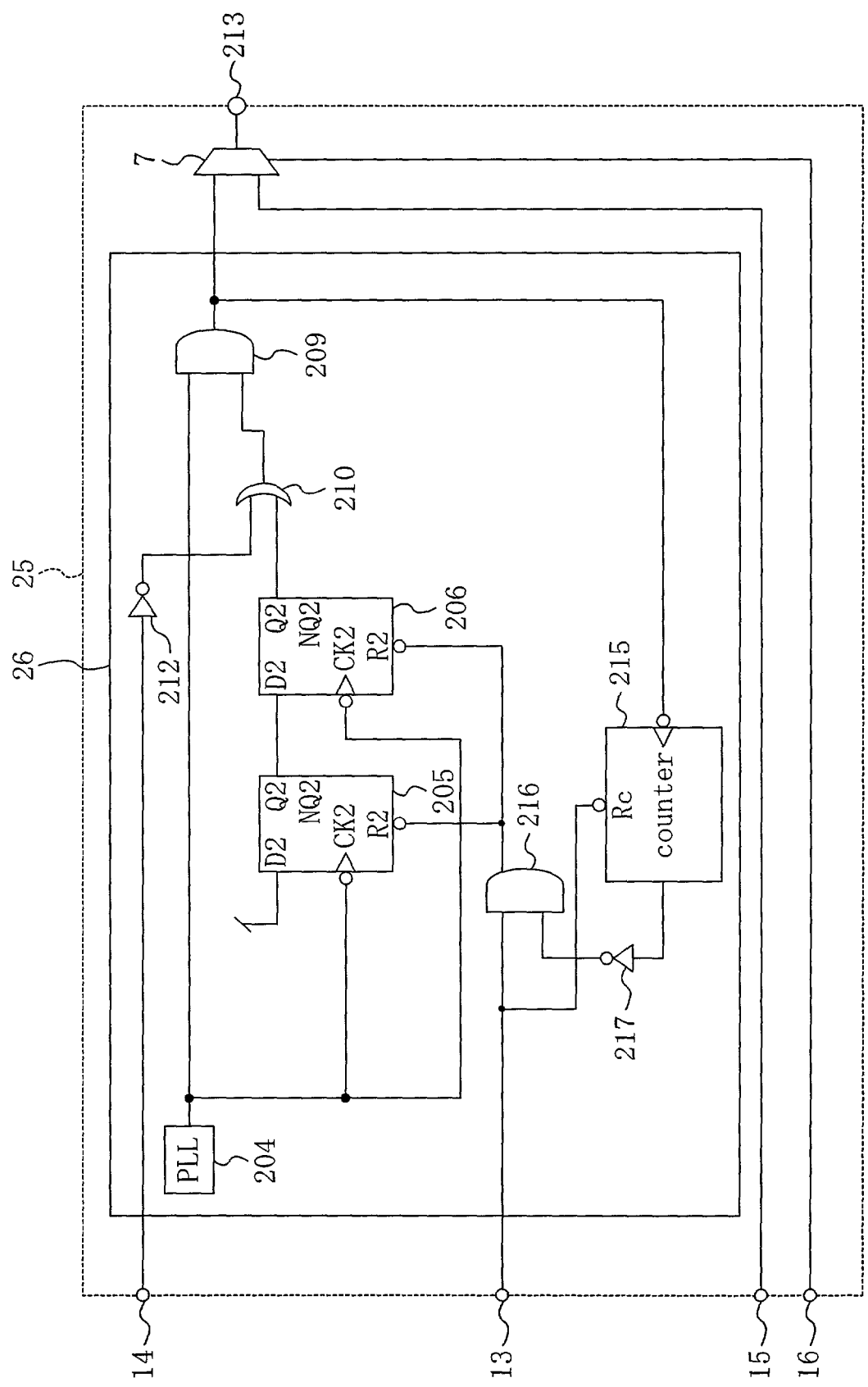
FIG. 6 is a circuit diagram showing a clock control portion.

FIG. 6 is a circuit diagram showing a clock control portion 25 of this embodiment. The semiconductor integrated circuit of this embodiment has substantially the same configuration as that of Embodiment 1, and differs therefrom only in that the clock control portion 25 shown in FIG. 6 has been provided in place of the clock control portion 5 of Embodiment 1. The circuit configuration of the clock control portion 25 of this embodiment is described below.

As shown in FIG. 6, the clock control portion 25 of this embodiment is provided with a clock generation portion 26, the selector 7, the clock control terminal 13, the test mode terminal 14, the test clock terminal 15, and the clock switching terminal 16.

The clock generation portion 26, as shown in FIG. 6, is provided with the PLL 204, the flip-flops 205 and 206, AND gates 209 and 216, the OR gate 210, inverters 212 and 217, and a counter 215.

The PLL 204 is connected to the AND gate 209 and the clock input terminals CK2 of the flip-flops 205 and 206.

The clock input terminals CK2 of the flip-flops 205 and 206 are connected to the PLL 204, and the output terminal Q2 of the flip-flop 205 is connected to the data terminal D2 of the flip-flop 206. Moreover, the data terminal D2 of the flip-flop 205 is connected to the power source and the output terminal Q2 of the flip-flop 206 is connected to the OR gate 210. Also, the reset terminals R2 of the flip-flops 205 and 206 are in connection with the clock control terminal 13 via the AND gate 216.

The input side of the inverter 212 is connected to the test mode terminal 14 and the output side of the inverter 212 is connected to the OR gate 210.

The input side of the AND gate 209 is connected to the PLL 204 and the OR gate 210, and the output side of the AND gate 209 is connected to the selector 7.

The counter 215 is provided with a reset terminal Rc connected to the clock control terminal 13. The counter 215 is branched to connect to the connection between the AND gate 209 and the selector 7 in order to detect the signal that is output from the AND gate 209. The counter 215 is also connected to the input side of the AND gate 216 via the inverter 217.

The input side of the selector 7 is connected to the AND gate 209, the test clock terminal 15, and the clock switching terminal 16, and the output side of the selector 7 is connected to the output terminal 213.

The flip-flops 205 and 206 obtain the logical value of the signal that is given to their data terminals D2 in synchronization with the falling signal that is input to their clock input terminals CK2, and output this value from their output terminals Q2. The value inverse to their output terminals Q2 is output by their output terminals NQ2. When a value of 0 is input to their reset terminals R2, then the logical value of the signal in their output terminals Q2 asynchronously becomes 0. It should be noted that the data terminals D2 of the flip-flops 205 and 206 are in connection with the power source, and thus the value that is input to their data terminals D2 is always 1.

When a 0 is input to its reset terminal Rc, the counter 215 asynchronously outputs 0, and when a 1 is input to its reset terminal Rc, the counter 215 outputs a signal with a logical value of 1 when the number of falls of the signal that is output from the AND gate 209 reaches a predetermined value. In this embodiment, a binary counter that outputs a signal with a logical value of 1 after the second fall of the signal output from the AND gate 209 is adopted for the counter 215, however, there is no limitation to this.

The delay test described below is for testing the semiconductor integrated circuit 1 shown in FIG. 4 in the same way as in Embodiment 1, except that the clock control portion of this embodiment is used in place of the clock control portion 5 of FIG. 1. It should be noted that the tester that is employed in this embodiment, as in Embodiment 1, supplies a test clock with a lower clock frequency than the operating clock frequency of the semiconductor integrated circuit 1.

The operation of the semiconductor integrated circuit 1 of this embodiment during actual operation and during testing is the same as when the clock control portion 5 of Embodiment 1 is employed. That is, during actual operation, by always fixing the logical value of the signal in the test mode terminal 14 at 0, the logical value of the signal that is output from the OR gate 210 is fixed at 1 and the output of the AND gate 209 is set to the output of the clock signal of the PLL 204.

During testing, the logical value of the signal in the test mode terminal 14 is always fixed at 1, and the logical value of the signal in the clock control terminal 13 is set to 0. At this time, a 0 is output from the output terminals Q2 of the flip-flops 205 and 206 and from the counter 215. For this reason, the logical value of the signal that is output from the AND gate 209 is fixed at 0. To switch to the normal operation mode during testing, the logical value of the signal in the clock control terminal 13 is switched to 1, like in step St6 of Embodiment 1. The operation of the clock generation portion 26 in step St6 is described in detail below.

First, when the logical value of the signal input to the clock control terminal 13 is 0, then a signal with a logical value of 0 is output from the output terminals Q2 of the flip-flops 205 and 206. When the logical value of the signal that is input to the clock control terminal 13 is switched to 1, the flip-flops 205 and 206 obtain the logical value of the signal that is given to their data terminals D2 in synchronization with the falling signal that is input to their clock input terminals CK2, and then output that value from their output terminals Q2. The logical value of the signal in the data terminal D2 of the flip-flop 205 is always fixed at 1, so that a signal with a logical value of 1 is output from its output terminal Q2 in synchronization with the falling signal that is input to its clock input terminal CK2.

Next, the flip-flop 206 obtains the logical value of the signal given to its data terminal D2 in synchronization with the falling signal that is input to its clock input terminal CK2, and then outputs the obtained value to its output terminal Q2. Thus, a signal with a logical value of 1 is delivered to the output terminal Q2 of the flip-flops 205 and 206 in that order at each fall of the clock signal of the PLL 204 that is input to their clock input terminal CK2.

The output terminal Q2 of the flip-flop 206 is connected to the AND gate 209 via the OR gate 210. Thus, the result of the above operation is that the clock generation portion 26, as shown by the period T3 of FIG. 5, counts from the point (T2) at which the logical value of the signal that is input to the clock control terminal 13 is switched to 1 and starts outputting the clock signal of the PLL 204 from the AND gate 209 immediately after the second fall of the pulse that is output from the PLL 204.

Immediately after the falling second pulse after the clock signal begins to be output from the AND gate 209, the output of the counter 215 changes from 0 to 1, and moreover, the inverse value 0 is input to the AND gate 216 by the inverter 217. Thus, the logical value of the signal in the output terminals Q2 of the flip-flops 205 and 206 becomes 0, and the logical value of the signal output from the AND gate 209 is once again fixed at 0.

With this embodiment it is possible to execute the same delay test as in Embodiment 1.

Also, like Embodiment 1, the waveforms of the signals of the terminals of the semiconductor integrated circuit 1 when the delay test is executed are those shown in FIG. 5. That is, exactly two complete pulses output from the PLL 204 are supplied to the combinational circuit portion 8. Consequently, pulses at the frequency during operation, which is required in a delay test, can be used by employing the PLL 204 in the semiconductor integrated circuit 1, and thus a high speed tester is not necessary.

Furthermore, the counter 215 of this embodiment was described as a binary counter that outputs a 1 at the second fall of the signal of the AND gate 209, however, by for example changing the counter 215 to a counter that outputs a 1 at the third fall of the signal of the AND gate 209, it is clear that this embodiment is also valid for a delay test that requires three pulses in the normal operation mode during the test. That is, the counter 215 can be changed to a counter that outputs a signal with a logical value of 1 after the same number of falls as the number of pulses of the signal output from the AND gate 209 to be supplied in correspondence with the number of pulses to be supplied to the combinational circuit portion 8 during the normal operation mode.

Embodiment 3

Figure 7:
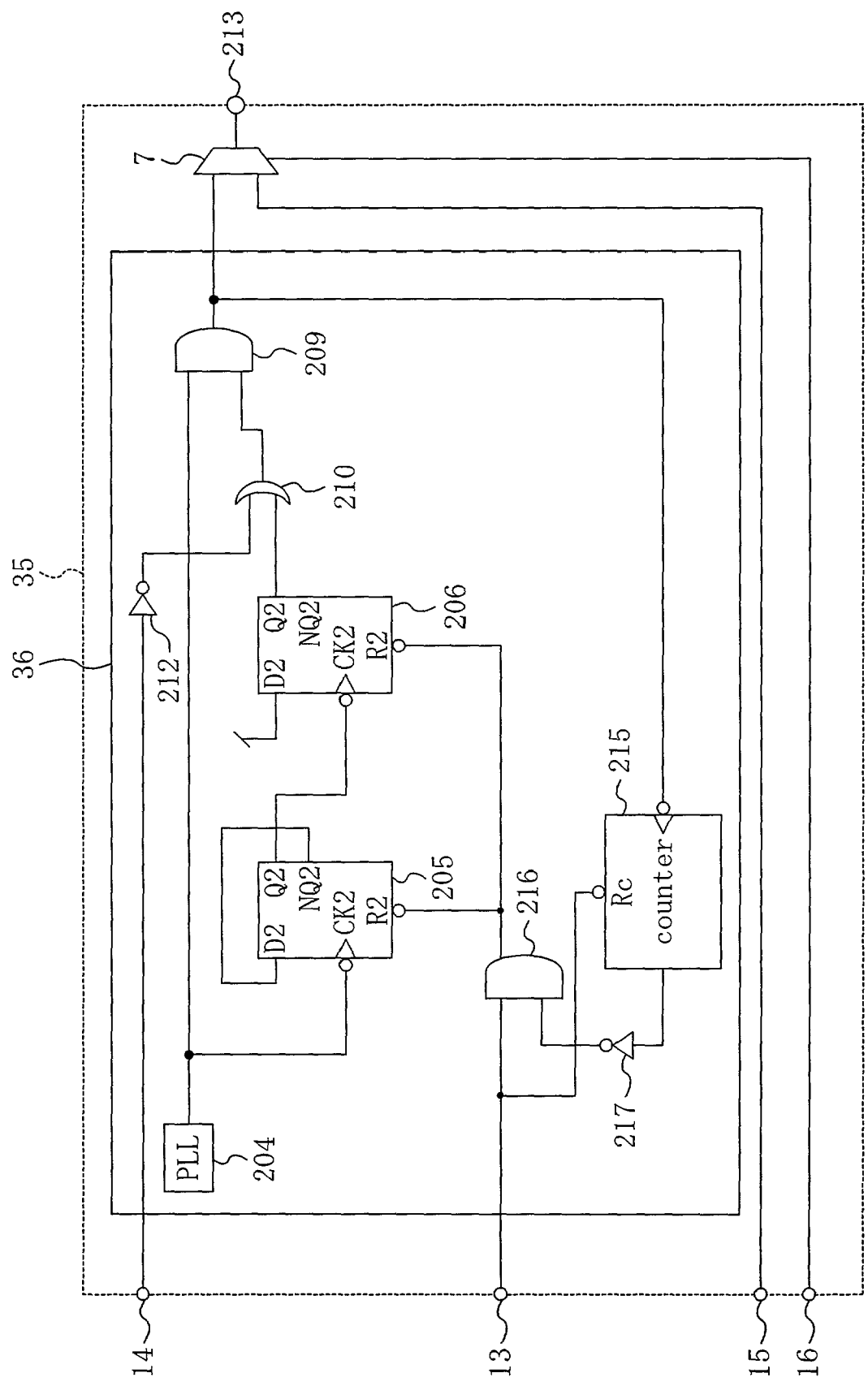
FIG. 7 is a circuit diagram showing a clock control portion.

FIG. 7 is a circuit diagram showing a clock control portion 35 according to this embodiment. The semiconductor integrated circuit of this embodiment has substantially the same configuration as that of Embodiment 1, and differs therefrom only in that the clock control portion 35 shown in FIG. 7 has been provided in place of the clock control portion 5 of Embodiment 1. The circuit configuration of the clock control portion 35 of this embodiment is described below.

As shown in FIG. 7, the clock control portion 35 of this embodiment is provided with a clock generation portion 36, the selector 7, the clock control terminal 13, the test mode terminal 14, the test clock terminal 15, and the clock switching terminal 16.

As shown in FIG. 7, the clock generation portion 36 is provided with the PLL 204, the flip-flops 205 and 206, the AND gates 209 and 216, the OR gate 210, the inverters 212 and 217, and the counter 215. The clock generation portion 36 of this embodiment differs from the clock generation portion 26 of Embodiment 2 in three aspects. These are: (1) the data terminal D2 of the flip-flop 205 is connected to the NQ2 terminal of the flip-flop 205; (2) the output terminal Q2 of the flip-flop 205 is connected to the clock input terminal CK2 of the flip-flop 206; and (3) the data terminal D2 of the flip-flop 206 is connected to the power source. Aside from these differences, the clock generation portion 36 of this embodiment has the same configuration as that of Embodiment 2.

In this embodiment, like in Embodiment 2, when a 0 is input to the reset terminal Rc of the counter 215, a 0 is output from the counter 215 asynchronously, and when its reset terminal Rc is 1, the counter 215 outputs a 1 when the number of falls of the signal that is output from the AND gate 209 has reached a predetermined number. A binary counter that outputs a 1 at the second fall of the signal of the AND gate 209 is employed as the counter 215 in this embodiment.

The method described below is for testing the semiconductor integrated circuit 1 in the same way as in Embodiment 1, except that the clock control portion 35 of this embodiment shown in FIG. 7 is used in place of the clock control portion 5 of FIG. 1. It should be noted that the tester that is employed in this embodiment, as in Embodiment 1, supplies a test clock with a lower clock frequency than the operating clock frequency of the semiconductor integrated circuit 1.

The operation of the semiconductor integrated circuit 1 of this embodiment during actual operation and during testing is the same as when the clock control portion 5 of Embodiment 1 is employed. That is, during actual operation, by always fixing the logical value of the signal in the test mode terminal 14 at 0, the logical value of the signal that is output from the OR gate 210 is fixed at 1 and the output of the AND gate 209 is set to the output of the clock signal of the PLL 204.

During testing, the logical value of the signal of the test mode terminal 14 is always fixed at 1, and the logical value of the signal of the clock control terminal 13 is set to 0. At this time, a 0 is output from the output terminals Q2 of the flip-flops 205 and 206 and from the counter 215. For this reason, the logical value of the signal that is output from the AND gate 209 is fixed at 0. To switch to the normal operation mode during testing, the logical value of the signal of the clock control terminal 13 is switched to 1, like in step St6 of Embodiment 1. The operation of the clock generation portion 36 in step St6 is described in detail below.

First, when the logical value of the signal input to the clock control terminal 13 is 0, then a signal with a logical value of 0 is output from the output terminals Q2 of the flip-flops 205 and 206, and a signal with a logical value of 1 is output from the output terminals NQ2 of the flip-flops 205 and 206. When the logical value of the signal that is input to the clock control terminal 13 is switched to 1, the flip-flops 205 and 206 obtain the logical value of the signal that is given to their data terminals D2 in synchronization with the falling signal that is input to their clock input terminals CK2, and then output that value from their output terminals Q2. The logical value of the signal in the data terminal D2 of the flip-flop 205 is equal to that of its output terminal NQ2. Thus, immediately after the logical value of the signal that is input to the clock control terminal 13 is switched to 1, the flip-flop 205, in synchronization with the falling signal that is input to its clock input terminal CK2, outputs a signal with a logical value of 1 from its output terminal Q2 and outputs a signal with a logical value of 0 from its output terminal NQ2. When the next signal is input to its clock input terminal CK2, the flip-flop 205 outputs a signal with a logical value of 0 from its output terminal Q2 and outputs a signal with a logical value of 1 from its output terminal NQ2 in synchronization with the fall of this signal. That is, the signal that is output from the flip-flop 205 becomes a clock signal in which the logical value of the signal from its output terminal Q2 is repeatedly alternated between 0 and 1 in synchronization with the rise and fall of the signal that is input to its clock input terminal CK2. The clock signal that is output from the output terminal Q2 of the flip-flop 205 has a waveform in which the frequency of the clock signal of the PLL 204 has been halved.

Next, the flip-flop 206 obtains the logical value of the signal that is given to its data terminal D2 and outputs that value from its output terminal Q2 in synchronization with the falling clock signal that is output from the output terminal Q2 of the flip-flop 205. Its data terminal D2 is connected to the power source, and thus the logical value of the signal that is given to its data terminal D2 is always 1. Consequently, a signal with a logical value of 1 is output from the output terminal Q2 of the flip-flop 206 in synchronization with the falling clock signal that is output from the output terminal Q2 of the flip-flop 205. At this time, the clock signal that is output from the output terminal Q2 of the flip-flop 205 has a waveform that is half the frequency of the clock signal of the PLL 204, and therefore a signal with a logical value of 1 starts being output from the output terminal Q2 of the flip-flop 206 immediately after the second fall of the pulse that is output from the PLL 204.

The output terminal Q2 of the flip-flop 206 is connected to the AND gate 209 via the OR gate 210. Thus, the result of the above operation is that the clock generation portion 36, as shown by the period T3 of FIG. 5 counts from the point (T2) at which the logical value of the signal that is input to the clock control terminal 13 is switched to 1 and starts outputting the clock signal of the PLL 204 from the AND gate 209 immediately after the second fall of the pulse that is output from the PLL 204.

Immediately after the falling second pulse after the clock signal begins to be output from the AND gate 209, the output of the counter 215 changes from 0 to 1, and the inverse value 0 is input to the AND gate 216 by the inverter 217. Thus, the logical value of the signal in the output terminals Q2 of the flip-flops 205 and 206 becomes 0, and the logical value of the signal output from the AND gate 209 is once again fixed at 0.

According to this embodiment, it is possible to execute the same delay test as in Embodiment 1 and Embodiment 2.

With the clock generation portion 26 of Embodiment 2, when there is a large skew between the clock input terminal CK2 of the flip-flop 205 and the clock input terminal CK2 of the flip-flop 206, there is a risk that after the logical value of the signal that is input to the clock control terminal 13 is changed to 1, the AND gate 209 will output the clock signal of the PLL 204 immediately after the first fall of the pulse of the clock signal that is output from the PLL 204.

However, with the clock generation portion 36, the clock signal that is output from the output terminal Q2 of the flip-flop 205 is input to the clock input terminal CK2 of the flip-flop 206. Consequently, there is the advantage that the output of the AND gate 209 is not affected as above, even if a large skew exists between the clock input terminal CK2 of the flip-flop 205 and the clock input terminal CK2 of the flip-flop 206.

Embodiment 4

Figure 8:
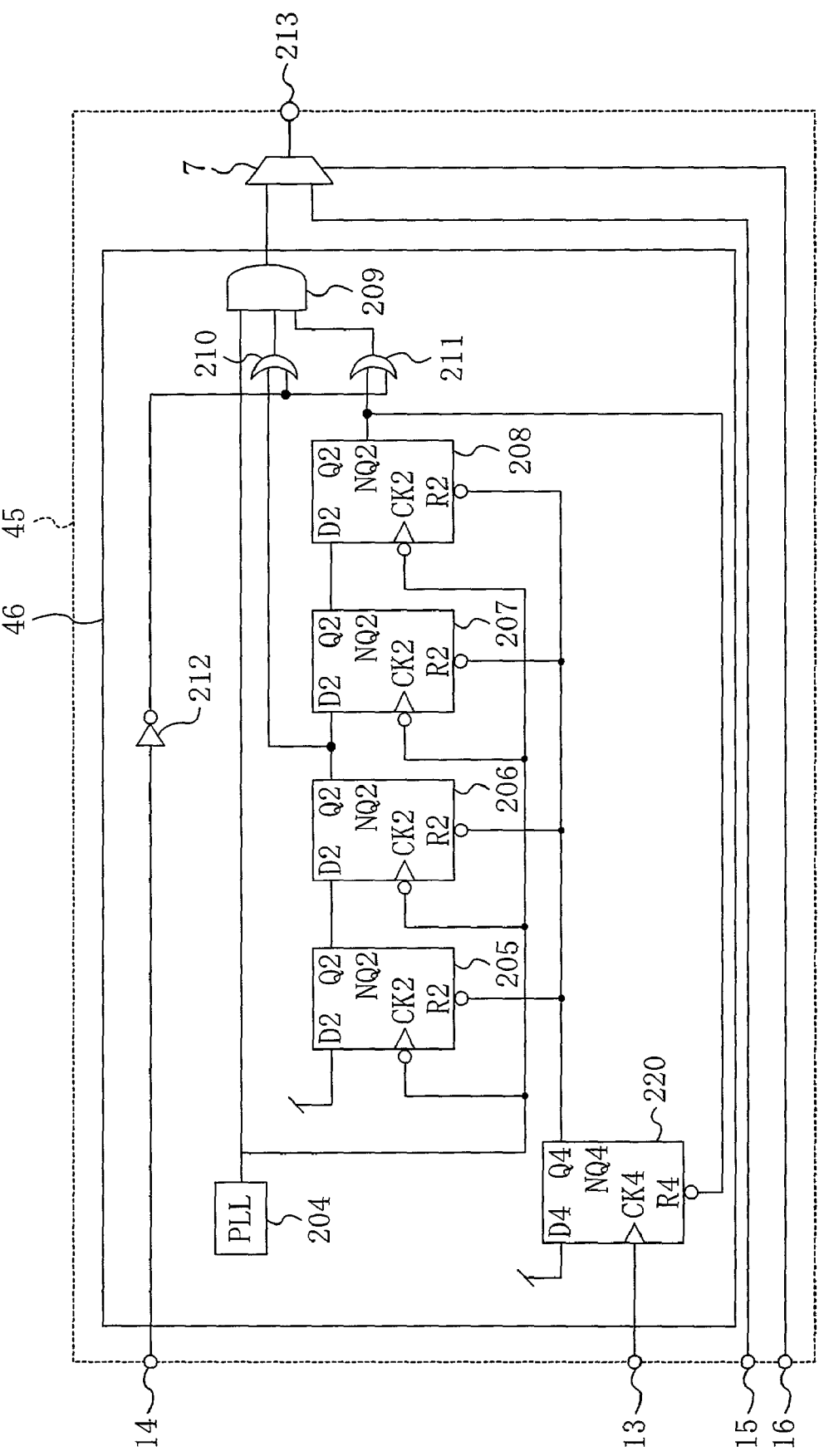
FIG. 8 is a circuit diagram showing a clock control portion.

FIG. 8 is a circuit diagram showing a clock control portion 45 according to this embodiment. The semiconductor integrated circuit of this embodiment has substantially the same configuration as that of Embodiment 1, and differs therefrom only in that the clock control portion 45 shown in FIG. 8 has been provided in place of the clock control portion 5 of Embodiment 1. The circuit configuration of the clock control portion 45 of this embodiment is described below.

As shown in FIG. 8, the clock control portion 45 is provided with a clock generation portion 46, the selector 7, the clock control terminal 13, the test mode terminal 14, the test clock terminal 15, and the clock switching terminal 16. The clock generation portion 46 is provided with the PLL 204, the flip-flops 205, 206, 207, and 208, the AND gate 209, and the OR gates 210 and 211.

As is clear form comparing FIG. 8 and FIG. 1, the clock generation portion 46 of this embodiment differs from the clock generation portion 6 of Embodiment 1 only in that it is provided with a flip-flop 220 of the same configuration as the flip-flops 205 to 208.

The data terminal D4 of the flip-flop 220 is connected to the power terminal, and is always fixed at 1. The reset terminal R4 of the flip-flop 220 is connected to the output terminal NQ2 of the flip-flop 208, and the output terminal Q4 of the flip-flop 220 is connected to the reset terminals R2 of the flip-flops 205 to 208. The clock input terminal CK4 of the flip-flop 220 is connected to the clock control terminal 13.

Next, a method for testing the semiconductor integrated circuit 1 in the same way as in Embodiment 1 by employing the clock control portion 45 of this embodiment shown in FIG. 8 in place of the clock control portion 5 of FIG. 1 is described below with reference to FIGS. 1, 8, and 9. FIG. 9 is a diagram showing the waveform of the signals of the terminals of the semiconductor integrated circuit 1 when a delay test is executed to test the semiconductor integrated circuit 1 using the clock control portion 45 of this embodiment. It should be noted that the reference numerals in FIG. 9 correspond to the reference numerals shown in FIGS. 1 and 8. In this embodiment, the clock frequency of the PLL 204 is twice the clock frequency of the test clock terminal 15. That is, the clock frequency of the test clock terminal 15 is half the clock frequency of the PLL 204.

The operation of the semiconductor integrated circuit 1 of this embodiment during actual operation is substantially the same as when the clock control portion 5 of Embodiment 1 is employed. That is, during actual operation, the logical value of the signal in the test mode terminal 14 is always fixed at 0, so that the logical value of the signal that is output from the OR gate 210 is fixed at 1 and the output of the AND gate 209 is set to the output of the clock signal of the PLL 204.

During testing, the logical value of the signal in the test mode terminal 14 is always fixed at 1, and the logical value of the signal in the clock control terminal 13 is set at 0. At this time, a 0 is output from the output terminals Q2 of the flip-flops 205 and 206 and from the counter 215. For this reason, the logical value of the signal that is output from the AND gate 209 is fixed at 0.

To switch to the normal operation mode during testing, the logical value of the signal in the clock control terminal 13 is switched to 1 like in step St6 of Embodiment 1. However, unlike Embodiment 1, one pulse is input to the clock control terminal 13 when the switch to the normal operation mode is made during testing. A specific description of the operation of the clock generation portion 46 in steps St6 and St7 is provided below.

First, when the logical value of the signal that is input to the clock control terminal 13 is 0, a signal with a logical value of 0 is output from the output terminals Q2 of the flip-flops 205 to 208. When the logical value of the signal that is input to the clock control terminal 13 is switched to 1, a single pulse is input to the clock input terminal CK4 of the flip-flop 220. The flip-flop 220, in synchronization with the falling signal of this input pulse, obtains the value that is input to its data terminal D4 (always 1) and outputs a signal with a logical value of 1 from its output terminal Q4. Consequently, the logical value of the signal in the reset terminals R2 of the flip-flops 205 to 208 becomes 1.

The flip-flops 205 to 208, in synchronization with the falling signal that is input to their clock input terminals CK2, obtain the logical value of the signal that is given to their data terminals D2 and output this value from their output terminals Q2. The logical value of the signal that is in the data terminal D2 of the flip-flop 205 is always fixed at 1, so that the flip-flop 205 outputs a signal with a logical value of 1 from its output terminal Q2 in synchronization with the falling signal that is input to its clock input terminal CK2.

Next, the flip-flops 206, 207, and 208, in synchronization with the falling signal that is input to their input terminals CK2, obtain the logical value of the signal that is given to their data terminals D2. This obtained value is then output to their output terminals Q2. Thus, a signal with a logical value of 1 is delivered to the output terminals Q2 of the flip-flops 205, 206, 207, and 208, in that order, with each fall of the clock signal of the PLL 204 that is input to their clock input terminals CK2.

The output terminal Q2 of the flip-flop 206 is connected to the AND gate 209 via the OR gate 210. Thus, as a result of the above operation, the clock generation portion 46, as shown by the period T3 in FIG. 9, counts from the point (T2) at which the logical value of the signal that is input to the clock control terminal 13 is switched to 1 and starts outputting the clock signal of the PLL 204 from the AND gate 209 immediately after the second fall of the pulse that is output from the PLL 204.

Next, as shown in FIG. 4, the clock output from the selector 7 is stopped in step St7. The output terminal NQ2 of the flip-flop 208 is connected to the AND gate 209 via the OR gate 211. Thus, as shown in the period T3 in FIG. 9, the flip-flop-208 counts from the point (T2) at which the logical value of the signal that is input to the clock control terminal 13 is switched to 1 and outputs a signal with a logical value of 0 from its output terminal NQ2 immediately after the falling fourth pulse that is output from the PLL 204 in order to once again fix the output of the AND gate 209 at 0.

Also, the output terminal NQ2 of the flip-flop 208 is connected to the reset terminal R4 of the flip-flop 220. Thus, immediately after the falling fourth pulse that is output from the PLL 204 counting from the point (T2) when the logical value of the signal that is input to the clock control terminal 13 is switched to 1, a signal with a logical value of 0 is input to the reset terminal R4 of the flip-flop 220 and the logical value of the signal in the output terminal Q4 of the flip-flop 220 becomes 0. Consequently, the logical value of the signal in the output terminals Q2 of the flip-flops 205 to 208 becomes 0, and the logical value of the signal output from the AND gate 209 is once again fixed at 0.

FIGS. 9A and 9B show the waveform of the signals from the terminals of the semiconductor integrated circuit 1 when the above delay test is executed. FIG. 9A is a diagram showing a case where the clock control terminal 13 and the scan-enable terminal 2 (and the clock switching terminal 16) are switched from the shift operation mode to the normal operation mode when the logical value of the clock signal of the PLL 204 is 0. FIG. 9B is a diagram showing a case where they are switched from the shift operation mode to the normal operation mode when the logical value of the clock signal of the PLL 204 is 1.

In the operation of the conventional configuration that is shown in FIG. 24B, which is the same as the state in FIG. 9B (when the clock control terminal 13 switches from 0 to 1, the subsequent time interval (LAG width in the diagram) to the initial fall of the clock that is output from the PLL 204 is very short), three pulses including the very narrow pulse P1 are supplied into the circuit. In contrast, with the configuration of the present embodiment, exactly two completely formed pulses output from the PLL 204 are supplied to the combinational circuit portion 8 in both the case of FIGS. 9A and 9B.

Consequently, pulses at the frequency during actual operation, which is necessary for a delay test, can be used by employing the PLL 204 in the semiconductor integrated circuit 1, and thus a high speed tester is not necessary.

If the clock generation portions 6, 26, and 36 of Embodiments 1 to 3 are used, then to input exactly two pulses to the combinational circuit portion 8 during the normal operation mode, the amount of time when the clock control terminal 13 is fixed at 1 must be set to a minimum of four falls of the PLL 204. However, if the clock generation portion 46 of this embodiment is employed, then it is possible to input exactly two pulses to the combinational circuit portion 8 by imparting only a single pulse to the clock control portion 13 during the normal operation mode, and thus there is the effect that the PLL 204 is easily controlled.

It should be noted that Embodiments 1 to 4 have been described adopting a PLL as a specific example of the oscillation circuit, but in place of a PLL it is also possible to use other types of circuits that generate a periodic clock signal, such as a DLL.

Also, the reason that a low-frequency clock signal was used for the test clock that is supplied from the tester via the test cock terminal 15 during the shift operation mode in Embodiments 1 to 4 is described below.

As a first reason, in the shift operation mode, the use of a clock signal at the high frequency during actual operation is not necessary, and conversely, the use of a low-speed clock signal is advantageous in accurately performing the shift operation.

As a second reason, scan-in data must be given from the scan-in terminal 3 in synchronization with the test clock during the shift operation mode. Even if the clock signal of the PLL 204 is employed as the clock signal during shift operation mode, this would not change the fact that scan-in data must be given from the tester to the scan-in terminal 3. That is, a tester capable of supplying a test clock at the same frequency as the clock signal of the PLL 204 must be used. Consequently, if the clock signal of the PLL 204 has a very high frequency, then it is extremely costly to impart the scan-in data.

An embodiment in which a built-in self test (BIST) is performed is described next.

Embodiment 5

First, the configuration of the semiconductor integrated circuit of this embodiment is described.

Figure 10:
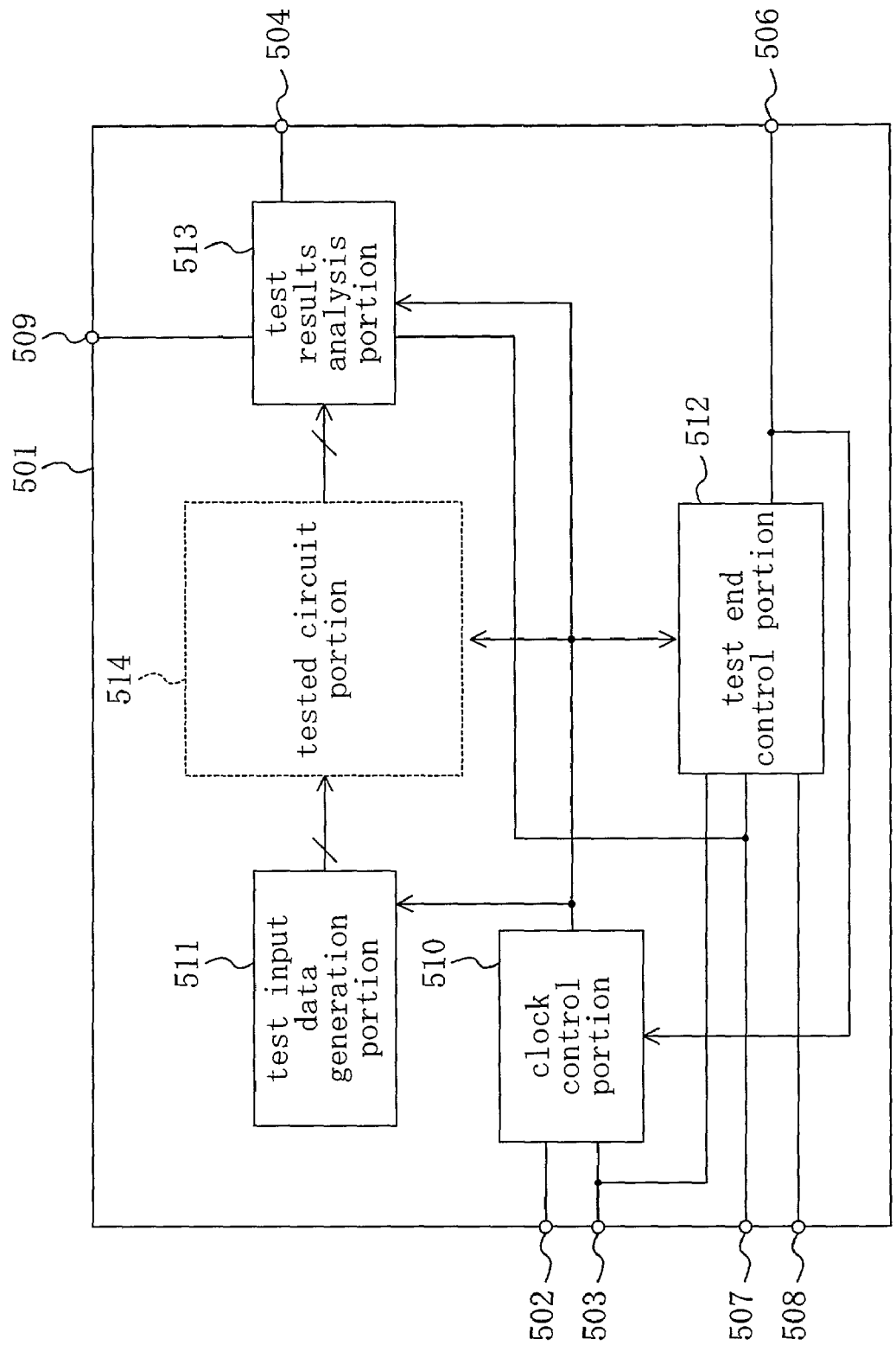
FIG. 10 is a circuit diagram of a semiconductor integrated circuit.

FIG. 10 is a circuit diagram of the semiconductor integrated circuit of this embodiment. A semiconductor integrated circuit 501 of this embodiment has been provided with a configuration for executing a built-in self test (BIST).

As shown in FIG. 10, the semiconductor integrated circuit 501 is provided with a test mode terminal 502, a test start terminal 503, a determined result output terminal 504, a test stop terminal 506, a test clock terminal 507, a pulse number setting terminal 508, an expected value setting terminal 509, a clock control portion 510, a test input data generation portion 511, a test results analysis portion 513, a test end control portion 512, and a tested circuit portion 514. In this embodiment, an LFSR (Linear Feedback Shift Register) is used for the test input data generation portion 511.

Figure 11:
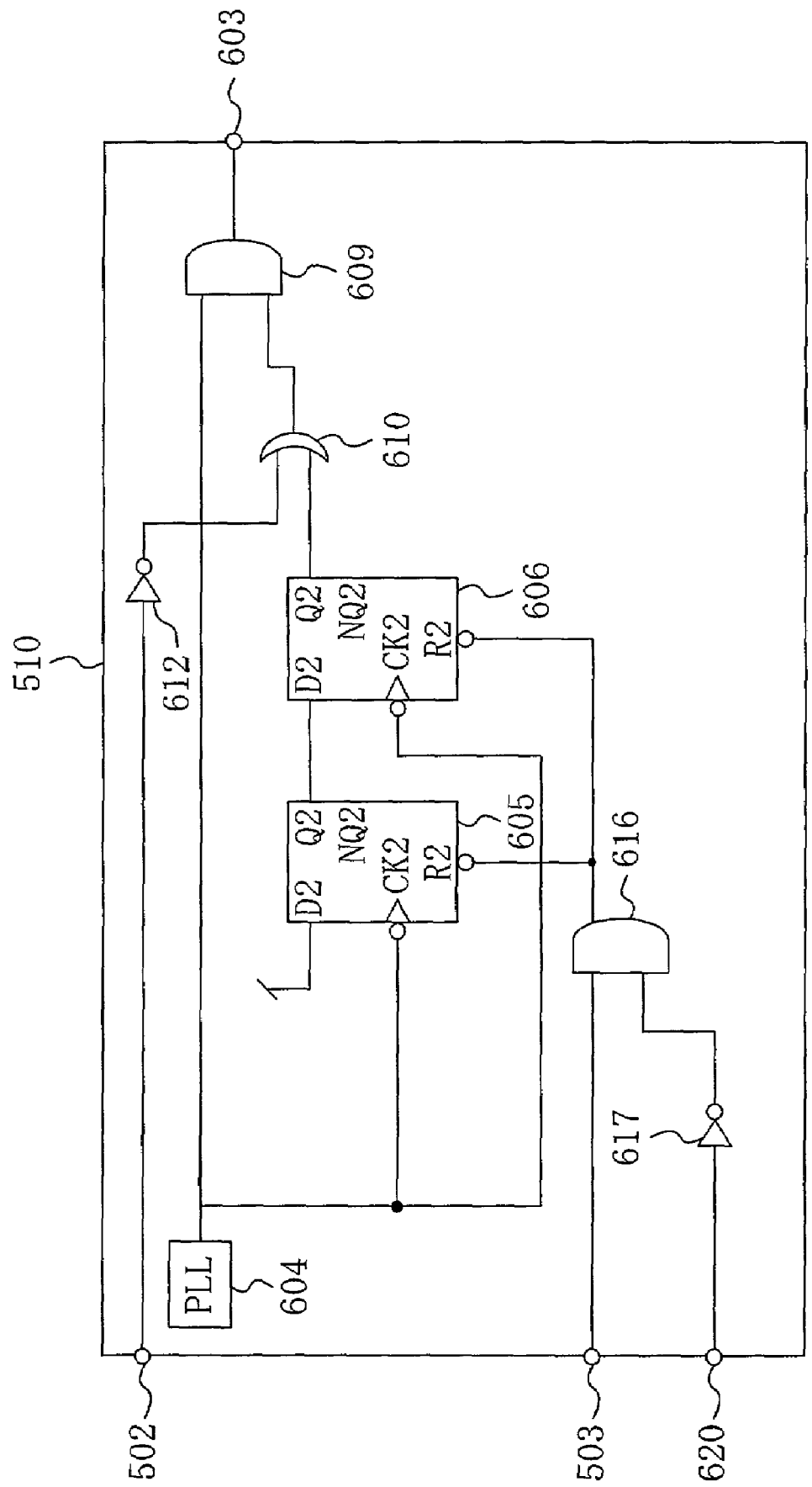
FIG. 11 is a circuit diagram showing the clock control portion in FIG. 10.

FIG. 11 is a circuit diagram showing the clock control potion 510 in FIG. 10. The clock control portion 510 is provided with a test start terminal 503, a test mode terminal 502, a clock output terminal 603, a PLL 604, flip-flops 605 and 606, AND gates 609 and 616, an OR gate 610, inverters 612 and 617, and a test stop terminal 620.

The PLL 604 is connected to the AND gate 609 and to the clock input terminals CK2 of the flip-flops 605 and 606.

The output terminal Q2 of the flip-flop 605 and the data terminal D2 of the flip-flop 606 are connected to one another. Also, the reset terminals R2 of the flip-flops 605 and 606 are connected to the test start terminal 503 by way of the AND gate 616 and to the test stop terminal 620 via the inverter 617. The data terminal D2 of the flip-flop 605 is connected to the power source, and the output terminal Q2 of the flip-flop 606 is connected to the OR gate 610.

The input side of the inverter 612 is connected to the test mode terminal 502 and the output side of the inverter 612 is connected to the OR gate 610.

The input side of the AND gate 609 is connected to the PLL 604 and the OR gate 610, and the output side of the AND gate 609 is connected to the clock output terminal 603.

The flip-flops 605 and 606, in synchronization with the falling signal that is input to their clock input terminals CK2, obtain the logical value of the signal that is given to their data terminals D2 and output this value from their output terminals Q2. The inverse value of their output terminals Q2 is output from their output terminals NQ2. When 0 is input to their reset terminals R2, a signal with a logical value of 0 is output from their output terminals Q2 asynchronous with the clock signal that is input to their clock input terminals CK2. It should be noted that the data terminal D2 of the flip-flop 605 is connected to the power source, and thus the value that is input to its data terminal D2 is always 1.

Figure 12:
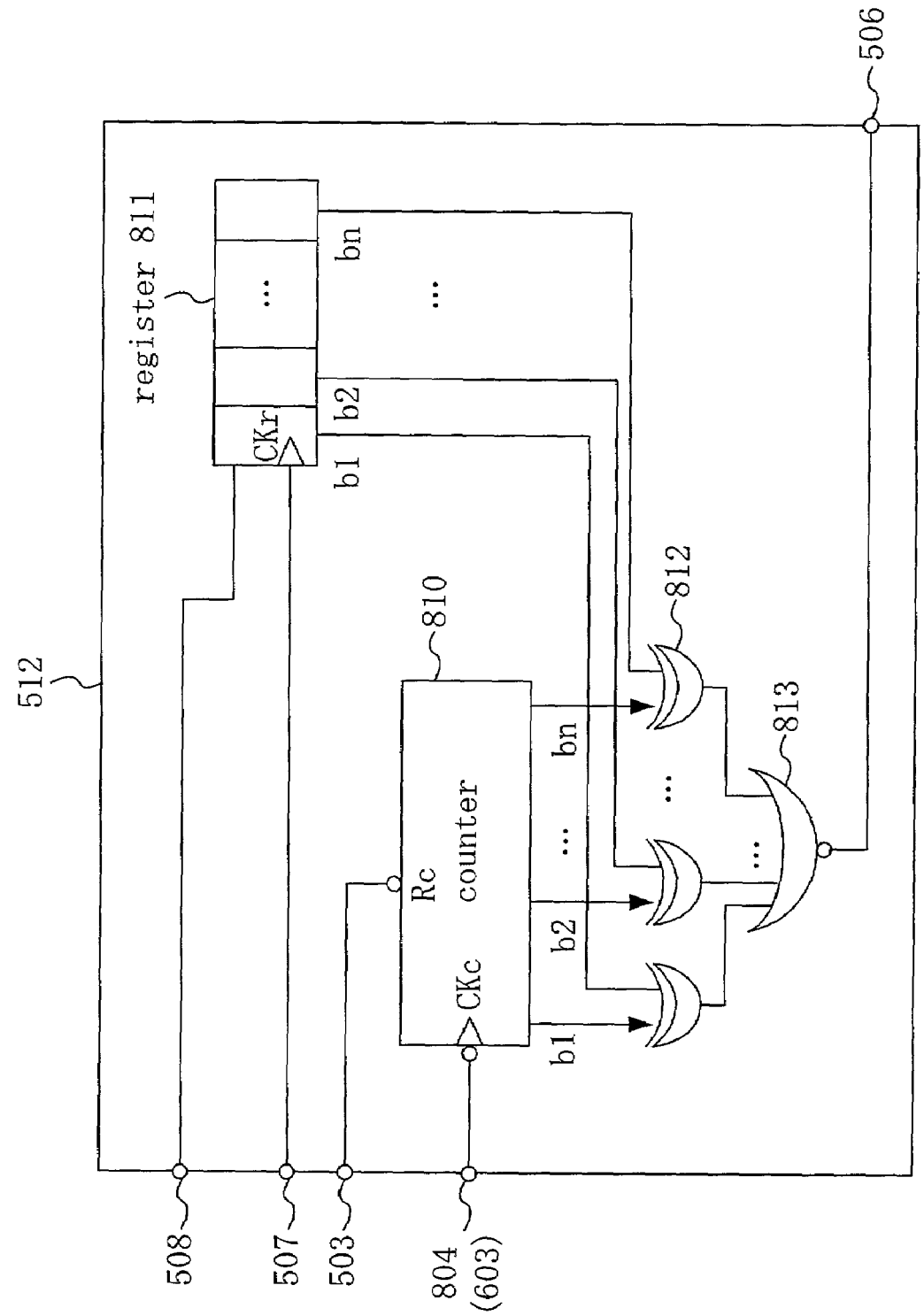
FIG. 12 is a circuit diagram of the test end control portion in FIG. 10.

The test end control portion of this embodiment will be described next. FIG. 12 is a circuit diagram of the test end control portion 512 in FIG. 10.

The test end control portion 512 of this embodiment is provided with a pulse number setting terminal 508, a test clock terminal 507, a test start terminal 503, a clock input terminal 804 that is connected to the clock output terminal 603 of the clock control portion 510, a test stop terminal 506, a counter 810, a register 811, a plurality (n) of ExOR gates 812, and a NOR gate 813.

The counter 810 is provided with a reset terminal Rc that is connected to the test start terminal 503, a clock input terminal CKc that is connected to the clock input terminal 804, and bits b1 to bn. The bits b1 to bn of the counter 810 are connected to the ExOR gates 812.

During the period that the logical value of the signal that is input to the test start terminal 503 of the counter 810 is 0, a signal with a logical value of 0 is input to the reset terminal Rc of the counter 810 so that all bits b1 to bn of the counter 810 are constantly initialized to a value of 0. When the value of the test start terminal 503 is 1 and the clock is input from the clock terminal 804, then the counter 810 counts up one at a time in synchronization with the falling pulsed signal.

The register 811 is connected to the pulse number setting terminal 508, and is provided with a clock input terminal CKr that is connected to the test clock terminal 507, and with bits b1 to bn. The bits b1 to bn of the register 811 are connected to the ExOR gates 812 to correspond to the bits b1 to bn of the counter 810, respectively.

The n ExOR gates 812 are connected to the NOR gate 813.

Figure 13:
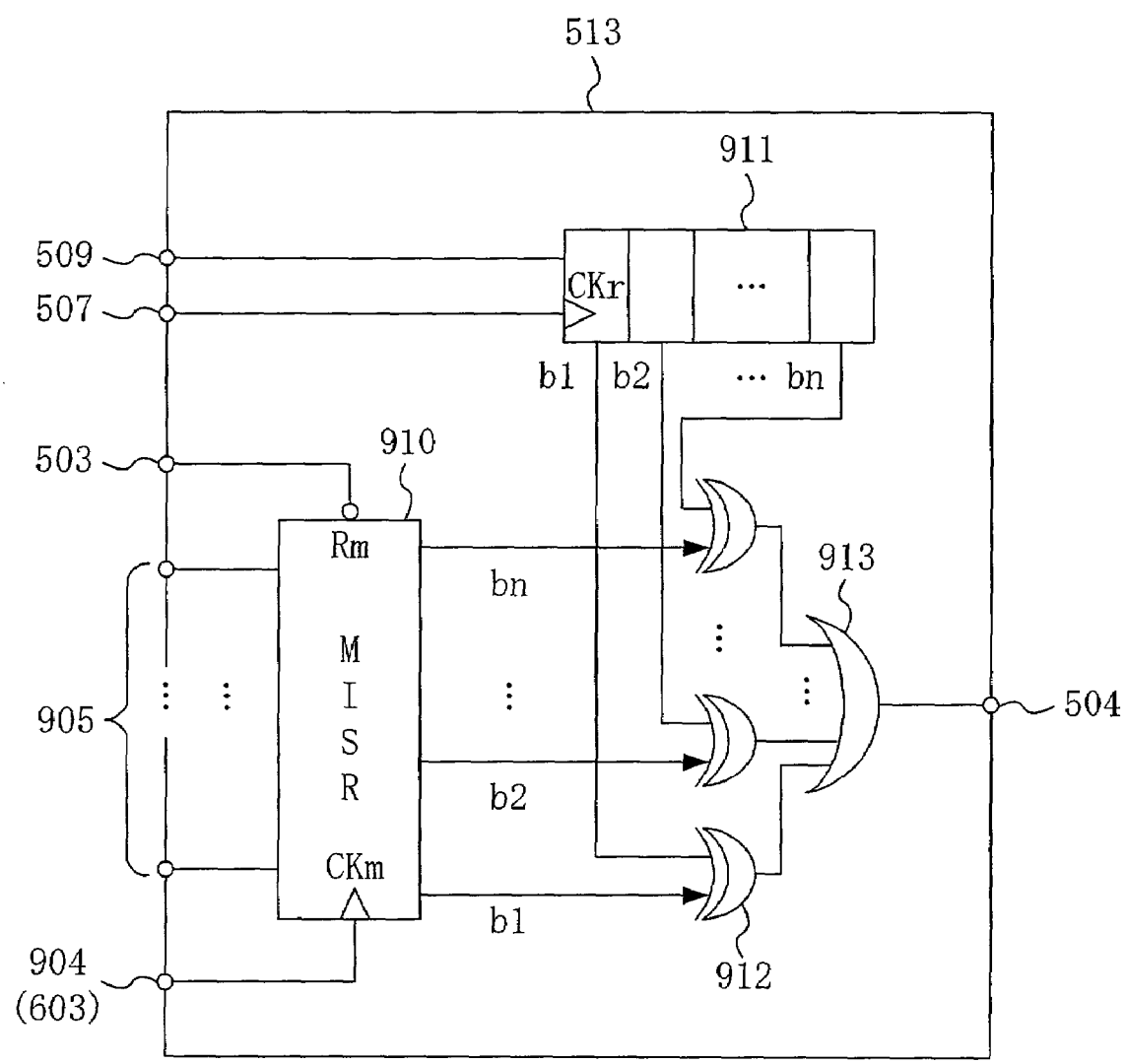
FIG. 13 is a circuit diagram of the test results analysis portion in FIG. 10.

The test results analysis portion of this embodiment is described next. FIG. 13 is a circuit diagram of the test results analysis portion 513 in FIG. 10.

The test results analysis portion 513 is provided with an expected value setting terminal 509, a test clock terminal 507, a test start terminal 503, a clock terminal 904 that is connected to the clock output terminal 603, terminals 905 for inputting the data output from the tested circuit portion 514, a determined result output terminal 504, a MISR (Multi-Input Signature Register) 910, an expected value register 911, ExOR gates 912, and an OR gate 913.

The MISR 910 is provided with a reset terminal Rc that is connected to the test start terminal 503, a clock input terminal CKm that is connected to the clock input terminal 904, and bits b1 to bn that are connected to the data input terminals 905. The bits b1 to bn of the MISR 910 are connected to the ExOR gates 912.

During the period that the logical value of the signal that is input to the test start terminal 503 is 0, a signal with a logical value of 0 is input to the reset terminal Rm of the MISR 910 so that all bits b1 to bn are constantly initialized to a value of 0. When the value of the test start terminal 503 is 1 and the clock is input from the clock terminal 904, the data that are output from the tested circuit portion 514 are compressed in synchronization with the falling pulsed signal.

The expected value register 911 is connected to the expected value setting terminal 509, and is provided with a clock input terminal CKr that is connected to the test clock terminal 507 and with bits b1 to bn. The bits b1 to bn of the expected value register 911 are connected to the ExOR gates 912 in correspondence with the bits b1 to bn of the MISR 910.

The n ExOR gates 912 are connected to the NOR gate 913.

During actual operation of the semiconductor integrated circuit 501 of this embodiment, the logical value of the signal that is input to the test mode terminal 502 is constant at 0. At this time, in the clock control portion 510, the output of the OR gate 610 is constant at 1, and thus the clock signal of the PLL 604 is output from the AND gate 609 unchanged.

Figure 14:
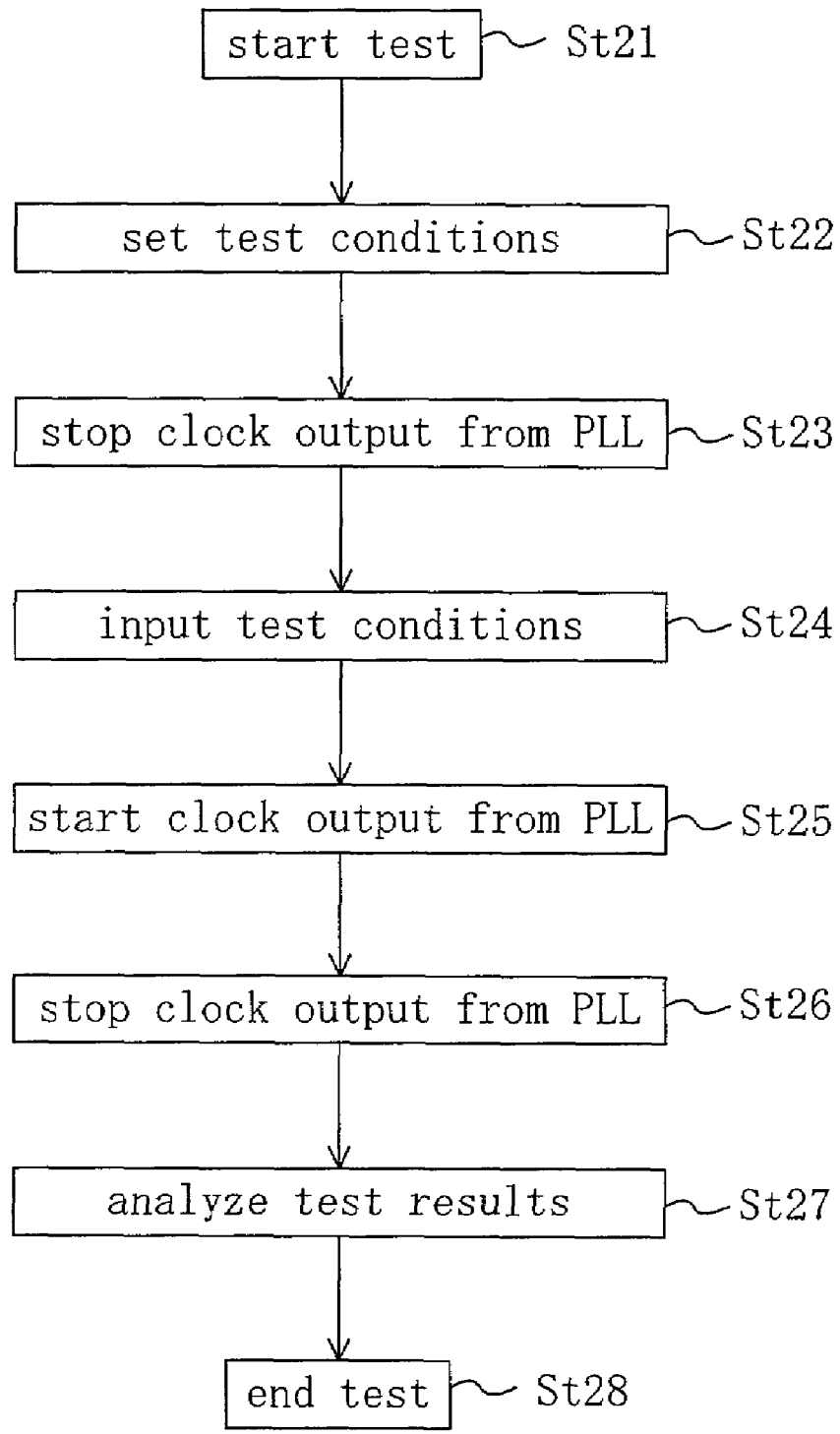
FIG. 14 is a flow chart showing a BIST.

A method of testing the semiconductor integrated circuit 501 is described next with reference to the drawings. FIG. 14 is a flow chart showing a BIST in which the semiconductor integrated circuit 501 of this embodiment is tested. FIG. 15 is a diagram showing the signal waveform of the terminals of the semiconductor integrated circuit 501 when the BIST for testing the semiconductor integrated circuit 501 of this embodiment is executed. It should be noted that the reference numerals in FIG. 15 correspond to the reference numerals that appear in FIGS. 10 to 13.

First, the test is started at step St21 as shown in FIG. 14.

Next, as shown in FIG. 14, the test conditions are set in step St22. More specifically, the number of pulses of the clock signal that is input to the tested circuit portion 514 for the test and the expected value of the value output from the MISR 910 when the test is ended are set. It is possible to estimate the testing time from the number of pulses of the clock signal that is input to the tested circuit portion 514 for the test and the clock frequency of the PLL 604.

Next, as shown in FIG. 14, in step St23, the clock signal of the PLL 604 is made to not be output from the clock output terminal 603. More specifically, the logical value of the signal at the test mode terminal 502 is set to 1. It should be noted that this value is always constant at 1 during testing. Next, the logical value of the signals at the test start terminal 503 and the test clock terminal 507 is set to 0. At this time, in the clock control portion 510, the value that is output from the output terminals Q2 of the flip-flops 605 and 606 is 0 (the value that is output from their output terminals NQ2 is 1). Thus, the output of the AND gate 609 is constant at 0 and the clock signal of the PLL 604 is no longer output from the clock output terminal 603. Furthermore, all the values of the counter 810 of the test end control portion 512 become 0.

Then, in step St24, the test conditions are input. More specifically, the clock signal from the test clock terminals 507 is input to the semiconductor integrated circuit 501, and in synchronization therewith, the test conditions that are set in step St22 are input to the register 811 and the expected value register 911 from the pulse number setting terminal 508 and the expected value setting terminal 509, respectively, through a scan-in operation. The clock that is input from the test clock terminal 507 at this time can be slower than the PLL 604.

The above steps St21 to St24 correspond to the period t1 in FIG. 15.

Next, in step St25, the clock signal of the PLL 604 is output from the clock output terminal 603. Step St25 corresponds to the period t3 in FIG. 15. More specifically, at the point of t2 shown in FIG. 15, the test start terminal 503 is set to 1. Due to this operation, the clock signal of the PLL 604 starts being output from the clock output terminal 603 as shown in FIG. 15. A more detailed description of the operation of the clock control portion 510 in step St25 follows hereinafter.

First, when the logical value of the signal that is input to the test start terminal 503 is 0, then a signal with a logical value of 0 is output from the output terminals Q2 of the flip-flops 605 and 606. When the logical value of the signal that is input to the test start terminal 503 is switched to 1, the flip-flops 605 and 606 obtain the logical value of the signal given to their data terminals D2 and output that value from their output terminals Q2 in synchronization with the falling signal input to their clock input terminals CK2. The logical value of the signal in the data terminal D2 of the flip-flop 605 is always fixed at 1, so that the flip-flop 605 outputs a signal with a logical value of 1 from its output terminal Q2 in synchronization with the falling signal that is input to its clock input terminal CK2.

Next, the flip-flop 606 obtains the logical value of the signal given to its data terminal D2 in synchronization with the falling signal that is input to its clock input terminal CK2. The obtained signal is then output to its output terminal Q2. Thus, a signal with a logical value of 1 is delivered to the output terminal Q2 of the flip-flops 605 and 606 in that order at each fall of the clock signal of the PLL 604 that is input to their clock input terminals CK2.

The output terminal Q2 of the flip-flop 606 is connected to the AND gate 609 via the OR gate 610. Thus, the result of the above operation is that the clock control portion 510, as shown in the period t3 of FIG. 15, counts from the point (T2) at which the logical value of the signal that is input to the test start terminal 503 is switched to 1 and starts outputting the clock signal of the PLL 604 from the AND gate 609 immediately after the falling second pulse that is output from the PLL 604.

When the clock signal of the PLL 604 has started to be output from the clock output terminal 603, a pseudo random number is generated from the test input data generation portion 511 in synchronization with the clock signal that is output from the clock output terminal 603. At this time, the counter 810 counts up one by one in order from 0, and until it reaches the same value as that of the register 811, a 0 is output from the test stop terminal 506. Moreover, the MISR 910 simultaneously compresses the data that are output from the tested circuit portion 514.

Next, in step St26, the clock signal of the PLL 604 from the clock output terminal 603 is stopped. Step St26 corresponds to the point t4 shown in FIG. 15. More specifically, when the value of the counter 810 is equal to the number of pulses of the clock signal that is designated at the register 811, then a signal with a logical value of 1 is output from the test stop terminal 506. The clock control portion 510 receives the signal with a logical value of 1 from the test stop terminal 620, which is connected to the test stop terminal 506, and the logical value of the signal that is output from the clock output terminal 603 is once again held constant at 0. Thus, the counter 810 is stopped from counting up, and at the same time, the generation of the pseudo random number from the test input data generation portion 511 and the operation of the MISR 910 are stopped.

Then, an analysis of the test results is performed in step St27. The value of the MISR 910 at this time serves as the basis for determining whether there is a fault in the tested circuit portion 514. By observing the results of a comparison of the value of the MISR 910 and the value stored in the expected value register 911 that can be expected when the tested circuit portion 514 is normal, it is possible to determine whether there is a fault at the tested circuit portion 514 from the determined result output terminal 504 using the tester.

Lastly, the test is ended in step St28.

A BIST can be executed by performing the above-mentioned operations of steps St21 to St28.

FIG. 15 is a diagram that shows the waveform of the signals in the terminals of the semiconductor integrated circuit 501 when the above BIST is executed. FIG. 15A is a diagram showing a case where the test start terminal 503 is switched from the shift operation mode to the normal operation mode when the logical value of the clock signal of the PLL 604 is 0. FIG. 15B is a diagram showing a case where the switch from the shift operation mode to the normal operation mode takes place when the logical value of the clock signal of the PLL 604 is 1.

Figure 25A:
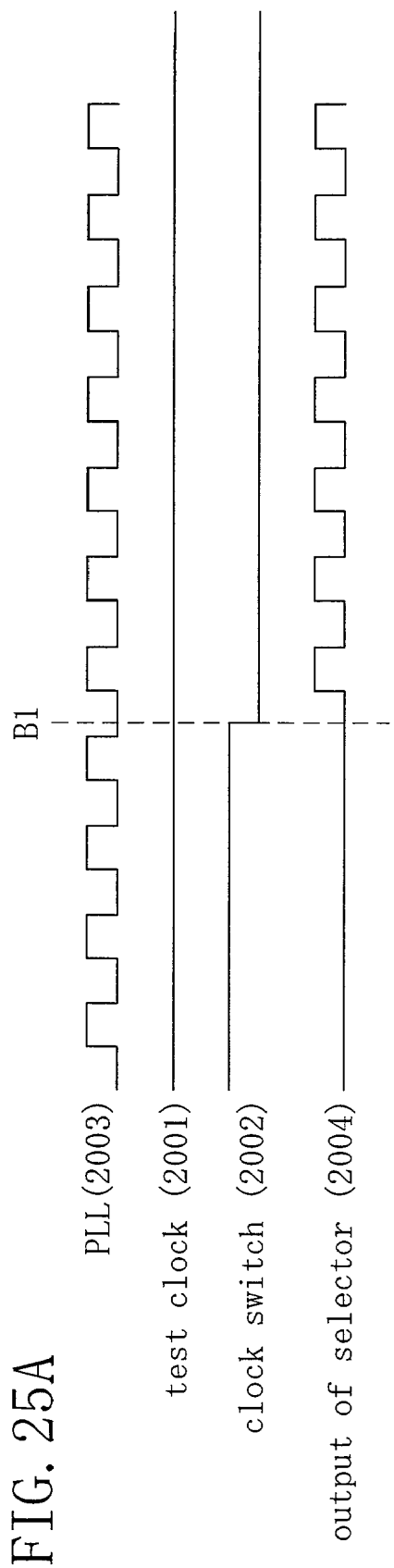
FIG. 25A and FIG. 25B are diagrams showing the signal waveform of the various portions of the conventional semiconductor integrated circuit when a BIST is executed.
Figure 25B:
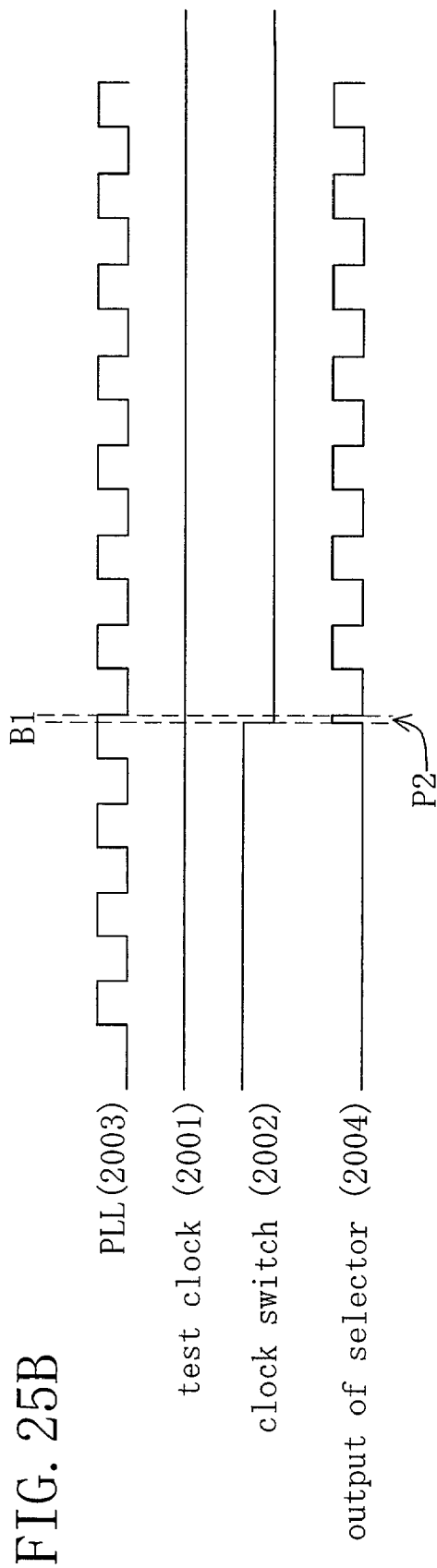

In the operation of the conventional configuration that is shown in FIG. 25B, which is the same condition as FIG. 15B (when the test start terminal 503 is switched from 0 to 1, the subsequent time interval (LAG width in the diagram) until the initial fall that is output from the PLL 604 is very short), pulses including the very narrow pulse P2 are supplied into the circuit. On the other hand, with the configuration of the present embodiment, the pulses of the clock signal output from the PLL 604 are output from the AND gate 606 of the clock control portion 510 as fully shaped pulses in both FIGS. 15A and 15B. Thus, this configuration does not lead to the malfunction of portions in the circuit.

Consequently, it is possible to utilize a clock signal of the frequency during actual operation, which is necessary in a BIST, by employing the PLL 604 within the semiconductor integrated circuit 501, and thus a high speed tester is not necessary.

Also, with the above testing method, the test can be performed even if the tester has not been provided with the capability of processing in accordance with the test stop signal from the test stop terminal 506.

Embodiment 6

Figure 16:
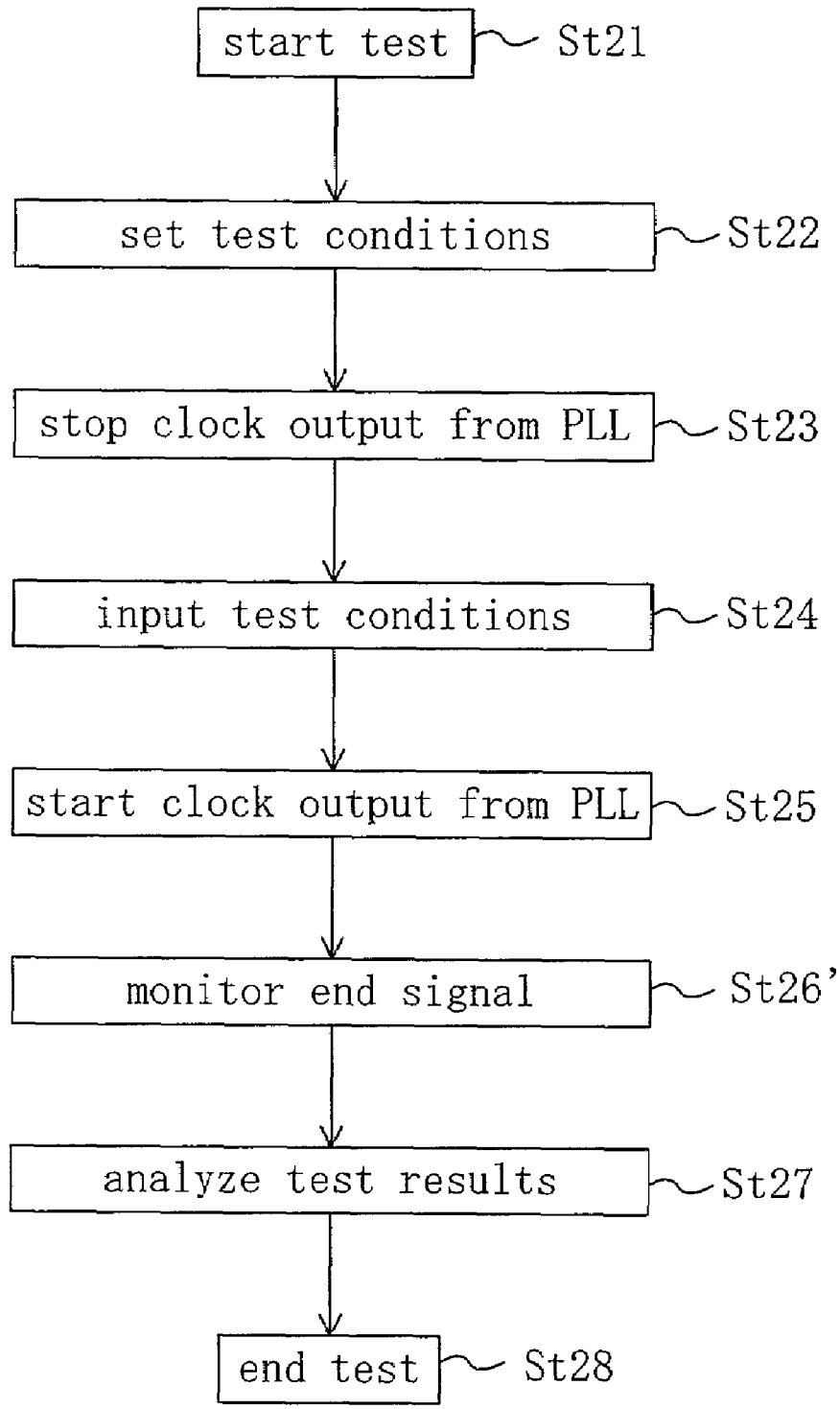
FIG. 16 is a flow chart illustrating a method of testing a semiconductor integrated circuit.

In this embodiment, the semiconductor integrated circuit testing method shown in FIG. 16 is described as the method for testing the semiconductor integrated circuit 501. FIG. 16 is a flow chart showing a method of testing the semiconductor integrated circuit 501. The semiconductor integrated circuit testing method shown in FIG. 16 differs from the semiconductor integrated circuit testing method according to Embodiment 5 only in that there is a step St26' for monitoring the signal from the test stop terminal 506, and all other steps are the same as those in Embodiment 5. Therefore, only step St26' will be described below.

In step St26', the test stop signal from the test stop terminal 506 is monitored using the tester. More specifically, the tester in the semiconductor integrated circuit testing method according to Embodiment 5, which is employed to observe, from the determined result output terminal 504, the results of a comparison of the value of the MISR 910 with the value accommodated in the expected value register 911 that can be expected if the tested circuit portion 514 is normal, can also be used to monitor the test stop signal from the test stop terminal 506. Accordingly, the tester is capable of directly performing an analysis of the test results after a test stop signal of 1 is output from the test stop terminal 506.

In the semiconductor integrated circuit testing method of FIG. 14, the test stop signal is not monitored, and thus the point at which the test stops cannot be determined externally. For this reason, a long time estimate must be made in advance in order to ensure that there is enough time between when testing stops and when the operation for analyzing the test results starts, and time is often wasted. However, in the above-mentioned semiconductor integrated circuit testing method shown in FIG. 16, the procedure immediately advances to analysis of the test results after the test has been stopped, and thus is advantageous in that time is not wasted.

Embodiment 7

A separate embodiment in which a built-in self test (BIST) is performed is described next.

First, the configuration of the semiconductor integrated circuit of this embodiment is described.

Figure 17:
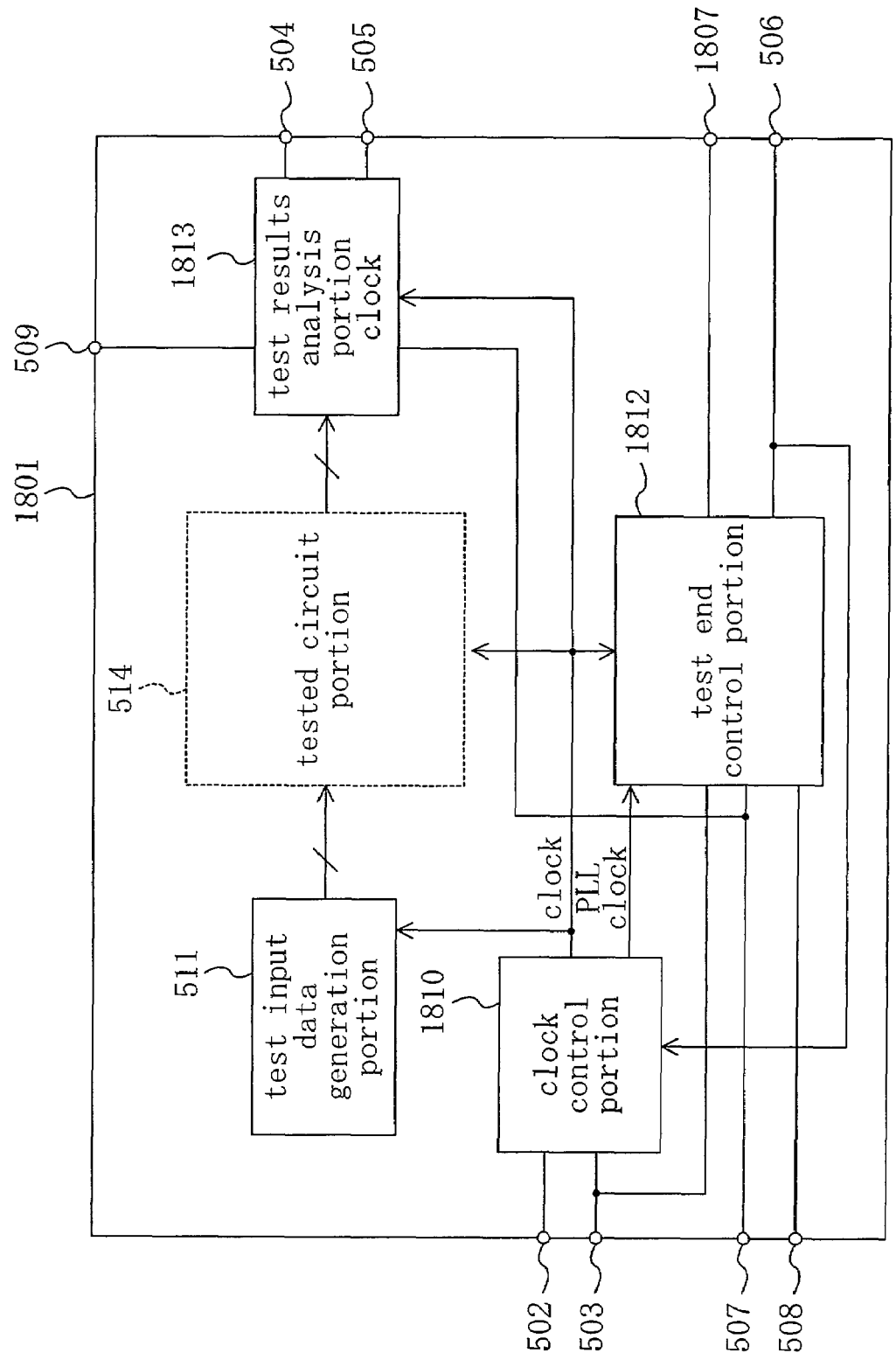
FIG. 17 is a circuit diagram of a semiconductor integrated circuit.

FIG. 17 is a circuit diagram of the semiconductor integrated circuit according to this embodiment. A semiconductor integrated circuit 1801 of this embodiment has been provided with a configuration for built-in self testing (BIST).

As shown in FIG. 17, the semiconductor integrated circuit 1801 is provided with a test mode terminal 502, a test start terminal 503, a determined result output terminal 504, a test result data output terminal 505, a test stop terminal 506, a test clock terminal 507, a pulse number setting terminal 508, an expected value setting terminal 509, a test end terminal 1807, a clock control portion 1810, a test input data generation portion 511, a test end control portion 1812, a test results analysis portion 1813, and a tested circuit portion 514. It should be noted that, as in Embodiment 5, an LFSR is adopted as the test input data generation portion 511.

Figure 18:
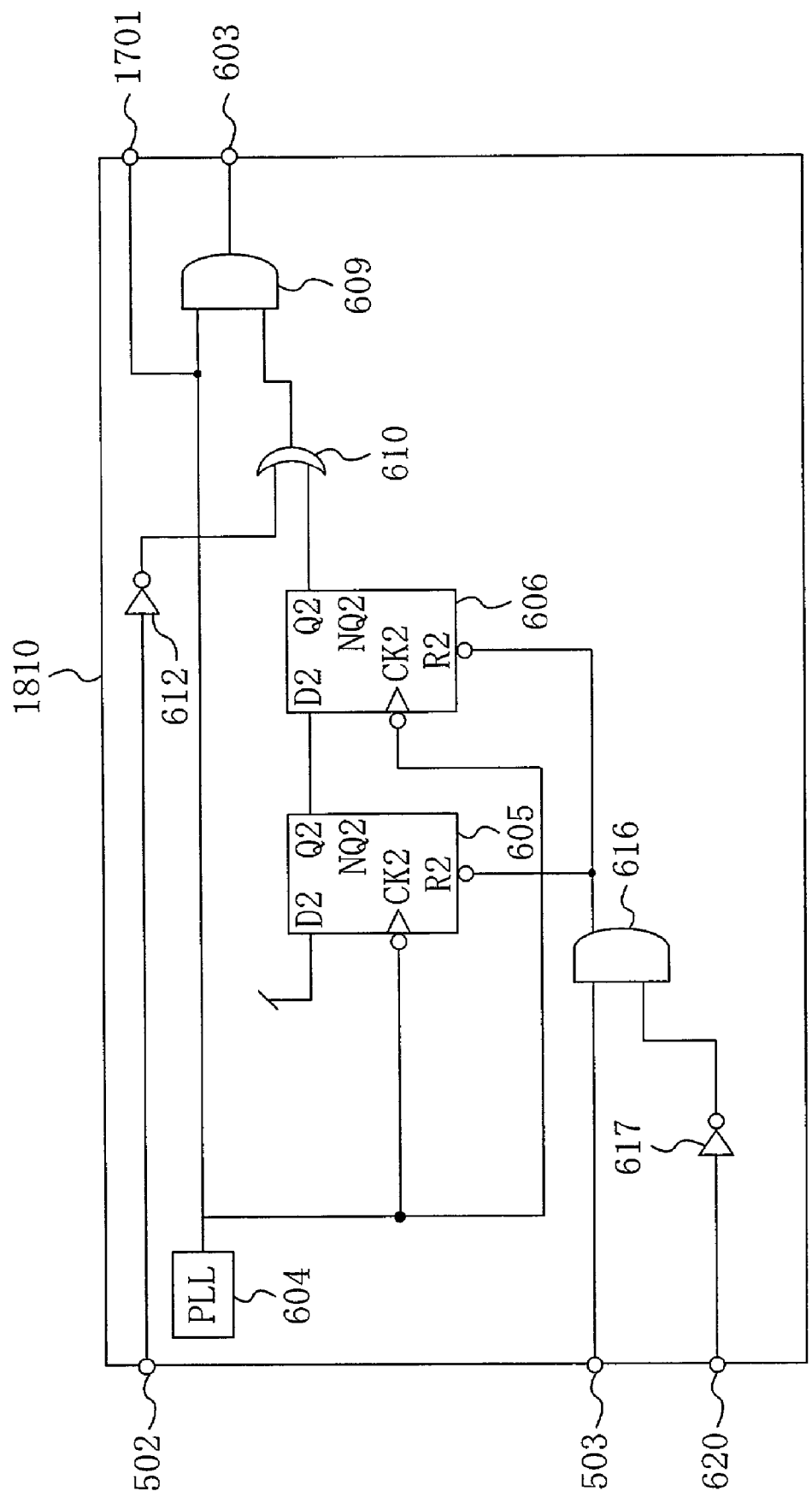
FIG. 18 is circuit diagram showing the clock control portion in FIG. 17.

FIG. 18 is a circuit diagram showing the clock control potion 1810 in FIG. 17. The clock control portion 1810 is provided with a test start terminal 503, a test mode terminal 502, a clock output terminal 603, a PLL 604, flip-flops 605 and 606, AND gates 609 and 616, an OR gate 610, inverters 612 and 617, and a test stop terminal 620.

As is clear from the above configuration, the clock control portion 1810 of this embodiment has substantially the same configuration as the clock control portion 510 of Embodiment 5. However, it differs therefrom in that a PLL clock terminal 1701 has been provided for transmitting the clock signal from the PLL to the test end control portion 1812 from the clock control portion 1810.

As shown in FIG. 17, the clock signal that is output from the clock control portion 1810 is supplied to the test input data generation portion 511, the test end control portion 1812, the test results analysis portion 1813, and the tested circuit portion 514. The clock signal that is output from the PLL 604 of the clock control portion 1810 is supplied to the test end control portion 1812.

Figure 19:
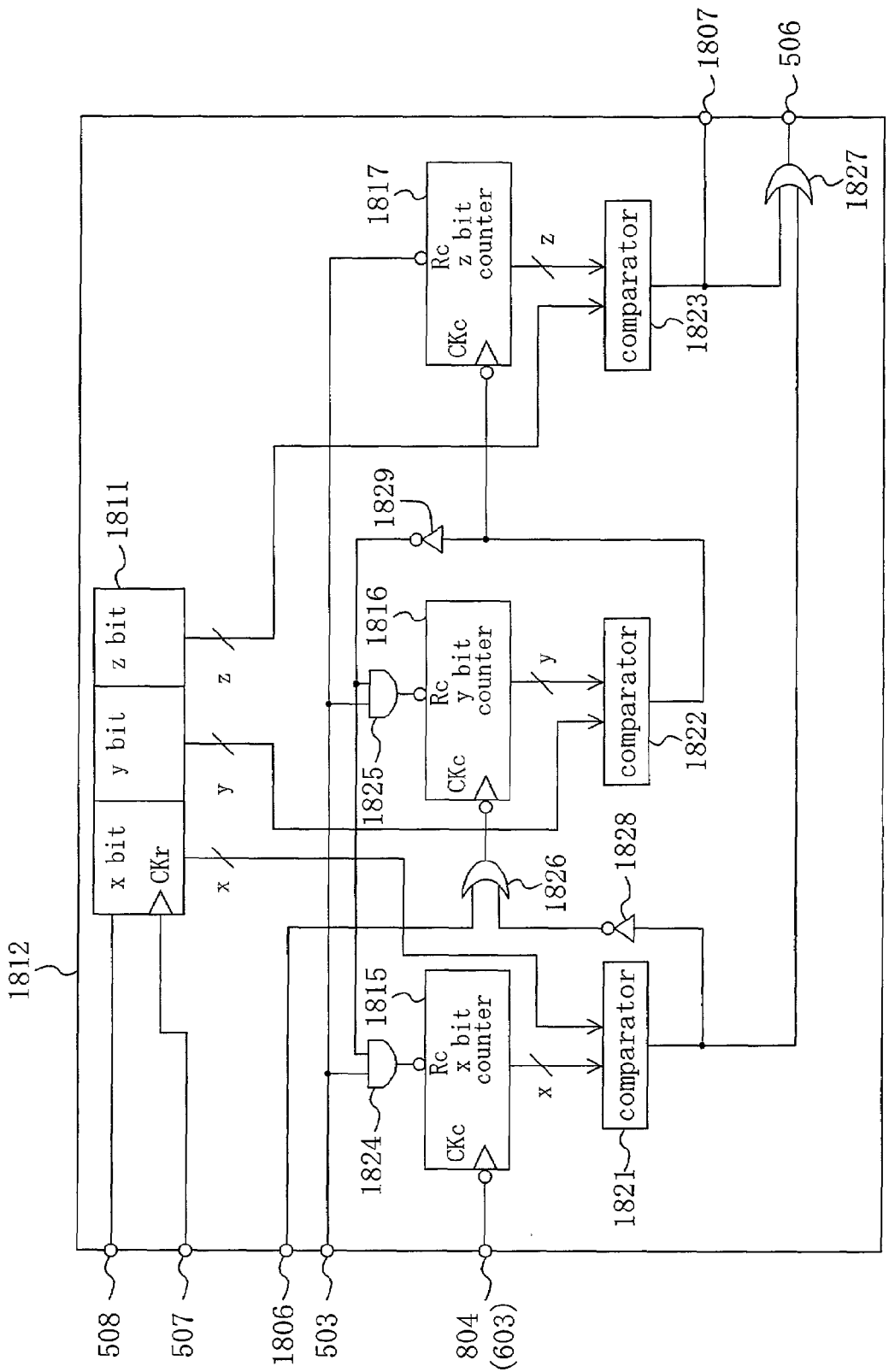
FIG. 19 is a circuit diagram of the test end control portion 1812 in FIG. 17.

The test end control portion of this embodiment is described next. FIG. 19 is a circuit diagram of the test end control portion 1812 in FIG. 17.

The test end control portion 1812 of this embodiment is provided with a pulse number setting terminal 508, a test clock terminal 507, a test start terminal 503, a clock input terminal 804 that is connected to the clock output terminal 603 of the clock control portion 1810, a test stop terminal 506, the PLL clock terminal 1701, a test end terminal 1807, a test time setting register 1811, an x bit counter 1815, a y bit counter 1816, a z bit counter 1817, comparators 1821 to 1823, AND gates 1824 and 1825, OR gates 1826 and 1827, and inverters 1828 and 1829.

The x bit counter 1815 and the y bit counter 1816 are each provided with a reset terminal Rc. These Rc terminals are connected to the test start terminal 503 via the AND gates 1824 and 1825, respectively. The z bit counter 1817 is also connected to the test start terminal 503.

During the period that the logical value of the signal that is input to the test start terminal 503 is 0, a signal with a logical value of 0 is input to the reset terminals Rc of the x bit counter 1815, the y bit counter 1816, and the z bit counter 1817 to initialize their values to 0. When the logical value of the signal of the test start terminal 503 is 1 and the clock signal is input from the input terminals CKc of the counters, then in synchronization with the fall of this pulsed signal, the values of the x bit counter 1815, the y bit counter 1816, and the z bit counter 1817 count up one by one.

The test time setting register 1811 is connected to the pulse number setting terminal 508, and is provided with a clock input terminal CKr that is connected to the test clock terminal 507 and with an x bit, a y bit, and a z bit. The x bit, the y bit, and the z bit of the test time setting register 1811 correspond to the x bit counter 1815, the y bit counter 1816, and the z bit counter 1817, respectively. The test time setting register 1811 is capable of using the x bit the y bit, and the z bit to set the time at which a single test is executed, the time at which an analysis of the test results is executed, and the number of times to repeatedly execute the test and the analysis of the test results. It should be noted that in this embodiment, the x, y, and z bits of the test time setting register 1811 form a scan chain through which numbers can be input, however, there is no limitation to this.

The input side of the comparator 1821 is connected to the x bit counter 1815 and the x bit of the test time setting register 1811, and the output side of the comparator 1821 is connected to the OR gate 1827 and the inverter 1828. The comparator 1821 outputs a signal with a logical value of 1 if the value of the x bit counter 1815 and the value of the x bit of the test time setting register 1811 are equal, and at all other times outputs a signal with a logical value of 0.

The input side of the comparator 1822 is connected to the y bit counter 1816 and the y bit of the test time setting register 1811, and the output side of the comparator 1822 is connected to the clock input terminal CKc of the z bit counter 1817 and to the AND gates 1824 and 1825 via the inverter 1829. The comparator 1822 outputs a signal with a logical value of 1 if the value of the y bit counter 1816 and the value of the y bit of the test time setting register 1811 are equal, and at all other times outputs a signal with a logical value of 0.

The input side of the comparator 1823 is connected to the z bit counter 1817 and to the z bit of the test time setting register 1811, and the output side of the comparator 1823 is connected to the test end terminal 1807 and to the OR gate 1827. The comparator 1823 outputs a signal with a logical value of 1 if the value of the z bit counter 1817 and the value of the z bit of the test time setting register 1811 are equal, and at all other times outputs a signal with a logical value of 0.

Figure 20:
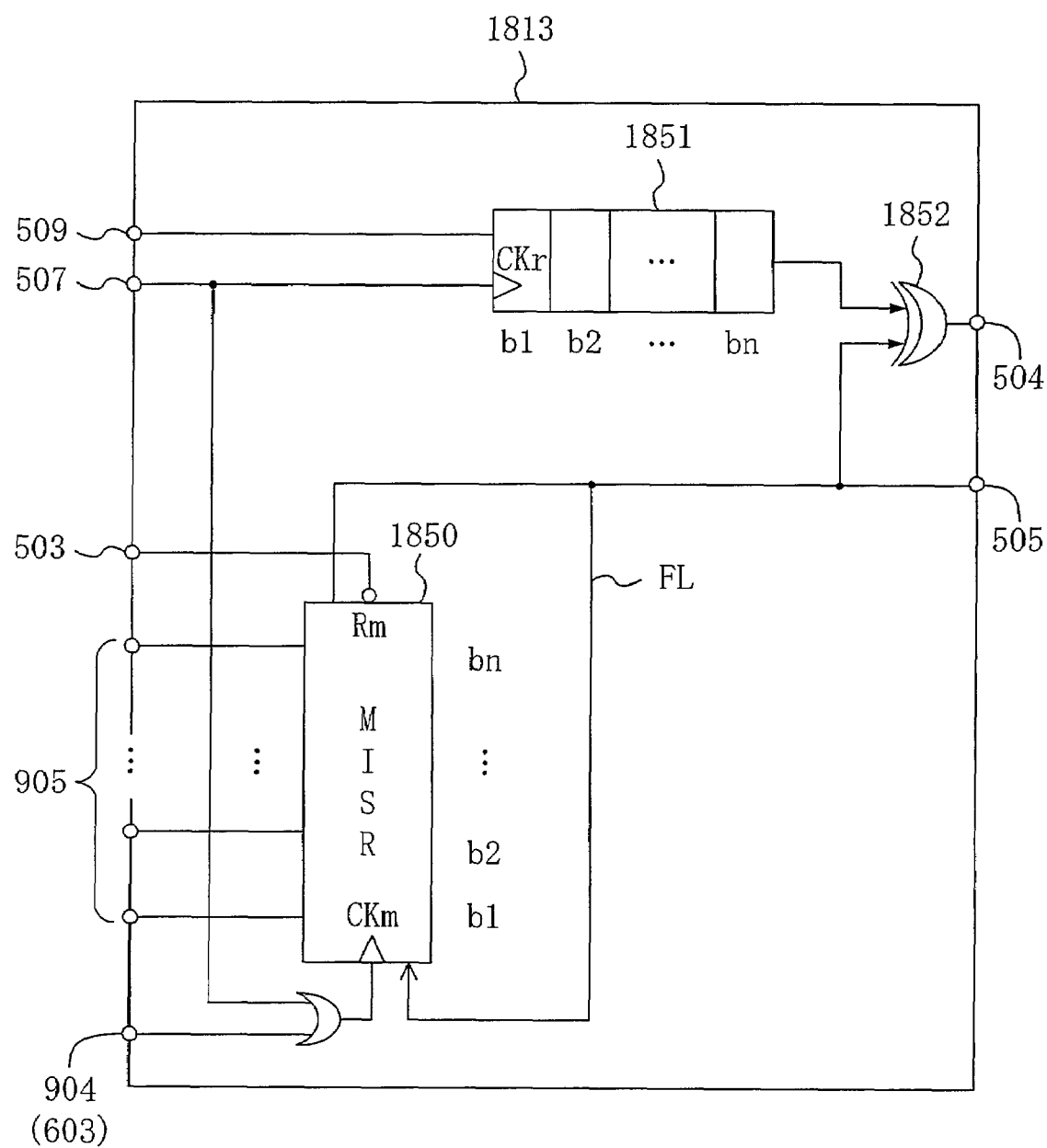
FIG. 20 is a circuit diagram showing the test results analysis portion.

FIG. 20 is a circuit diagram showing the test results analysis portion of this embodiment. The semiconductor integrated circuit of this embodiment has substantially the same configuration as that of Embodiment 5, and differs therefrom only in that the test results analysis portion 1813 shown in FIG. 20 is provided in place of the test results analysis portion 513 of Embodiment 5. The circuit configuration of the test results analysis portion 1813 of this embodiment is described below.

The test results analysis portion 1813 is provided with an expected value setting terminal 509, a test clock terminal 507, a test start terminal 503, a clock terminal 904 that is connected to the clock output terminal 603, terminals 905 for inputting the data output from the tested circuit portion 514, a determined result output terminal 504, a test results data output terminal 505, a MISR 1850, an expected value register 1851, an ExOR gate 1852, a line FL, and an OR gate 1853.

The MISR 1850 is provided with a reset terminal Rm that is connected to the test start terminal 503, a clock input terminal CKm that is connected to the test clock terminal 507 and the clock terminal 904 via the OR gate 1853, and bits b1 to bn that are connected to the data input terminals 905.

Regarding the MISR 1850, during the period that the logical value of the signal that is input to the test start terminal 503 is 0, a signal with a logical value of 0 is input to the reset terminal Rm of the MISR 910 so that the values of all its bits b1 to bn are always initialized to 0. When the value of the test start terminal 503 is 1 and the clock signal is input from the OR gate 1853, the data that are output from the tested circuit portion 514 are compressed by the MISR 1850 in synchronization with the falling pulsed signal. Furthermore, the MISR 1850 of this embodiment is also capable of functioning as a shift register, and outputs the values of the bits one bit at a time from the test results data output terminal 505 in synchronization with the clock signal that is input from the OR gate 1853. Also, the MISR 1850 of this embodiment simultaneously feeds back the output values of the bits back to those bits via the line FL. That is, the MISR 1850 also functions as a circular shift register.

The expected value register 1851 is connected to the expected value setting terminal 509, and is provided with a clock input terminal CKr that is connected to the test clock terminal 507 and with bits b1 to bn. The bits b1 to bn of the expected value register 1851 respectively correspond to the bits b1 to bn of the MISR 1850. The expected value register 1851 outputs the value of the bits one bit at a time in synchronization with the clock signal that is input from the test clock terminal 507.

The input side of the ExOR gate 1852 is connected to the output side of both the MISR 1850 and the expected value register 1851, and the output side of the ExOR gate 1852 is connected to the determined result output terminal 504.

Figure 21:
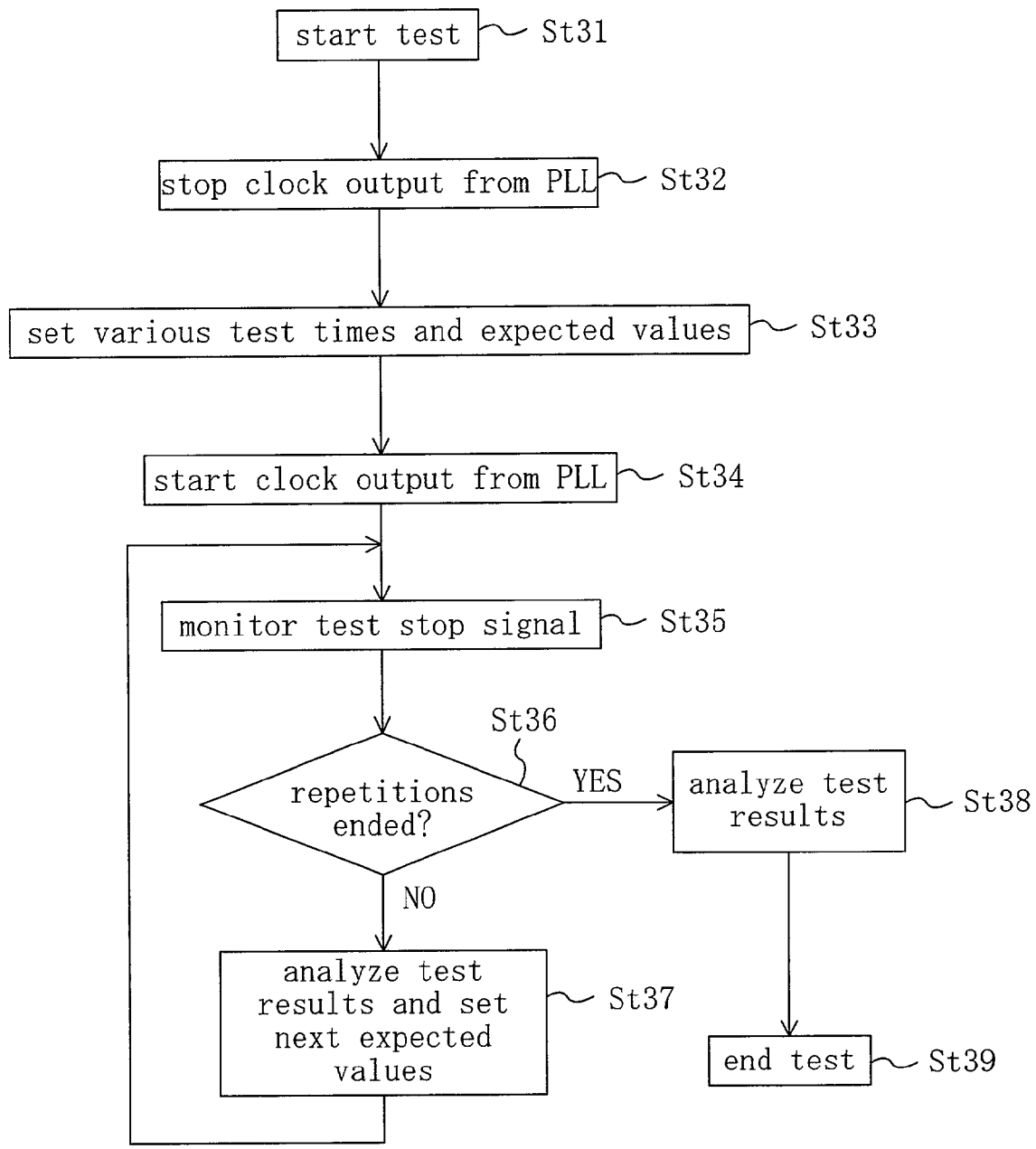
FIG. 21 is a flow chart showing a BIST in which the semiconductor integrated circuit is to be tested.

The method of testing the semiconductor integrated circuit 1801 is described next with reference to the drawings. FIG. 21 is a flow chart showing a BIST for testing the semiconductor integrated circuit 1801 of this embodiment. The waveforms of the signals of the various terminals of the semiconductor integrated circuit 1801 when the BIST for testing the semiconductor integrated circuit 1801 of this embodiment is executed are identical to those in FIG. 15 for Embodiment 5.

The semiconductor integrated circuit 1801 during actual operation operates the same way as in Embodiment 5. That is, the test mode terminal 502 is fixed at a value of 0. The OR gate 610 is fixed at an output of 0 at this time, so that the AND gate 609 outputs the clock signal of the PLL 604 as is.

First, as shown in FIG. 21, the test is started at step St31.

Next, as shown in FIG. 21, in step St32, the clock signal of the PLL 604 is inhibited from being output from the clock output terminal 603. More specifically, the logical value of the signal in the test mode terminal 502 is set to 1. It should be noted that this signal is constant at 1 during the test. Next, the logical value of the signals in the test start terminal 503 and in the test clock terminal 507 is set to 0. In the clock control portion 1810 at this time, the value that is output from the output terminals Q2 of the flip-flops 605 and 606 becomes 0 (the value that is output from their output terminals NQ2 becomes 1). Consequently, the output of the AND gate 609 is fixed at 0 and the clock signal of the PLL 604 is no longer output from the clock output terminal 603. Also, the values of the x bit counter 1815, the y bit counter 1816, and the z bit counter 1817 become 0.

Next, as shown in FIG. 21, in step St33, the test conditions are established and input. More specifically, the number of pulses of the clock signal that is input to the tested circuit portion 514 for the test and the expected value of the values that are output from the MISR 1850 when the test is over are set and input. The test conditions are input by inputting the clock signal from the test clock terminal 507 and synchronously scanning in from the pulse number setting terminal 508 and the expected value setting terminal 509 to the test time setting register 1811 and the expected value register 1851, respectively. The clock signal that is input from the test clock terminal 507 at this time can be lower frequency than the PLL 604. After the input of data to the test time setting register 1811 and the expected value register 1851 is finished, the value of the test clock terminal 507 is once again fixed at 0.

The above steps St31 to St33 correspond to the period t1 in FIG. 15.

Next, in step St34, the clock signal of the PLL 604 is output from the clock output terminal 603. Step St34 corresponds to the period t3 in FIG. 15. More specifically, the test start terminal 503 is set to 1 at the point t2 shown in FIG. 15. Due to this operation, the clock signal of the PLL 604 starts being output from the clock output terminal 603 as shown in FIG. 15. It should be noted that the clock control portion 1810 operates in step St34 in substantially the same way as how the clock control portion 510 operates in step St25 in Embodiment 5.

When the clock signal of the PLL 604 starts being output from the clock output terminal 603, a pseudo random number is generated from the test input data generation portion 511 in synchronization with the clock signal that is output from the clock output terminal 603. At this time, the counter 1815 counts up one by one in order from 0, and a value of 0 is output from the test stop terminal 506 and the test end terminal 1807 until the counter 1815 reaches the same value as the test time setting register 1811. Moreover, at the same time, the MISR 1850 compresses the data that are output from the tested circuit portion 514.

Next, in step St35, the test stop signal is monitored. Step St35 corresponds to the point t4 shown in FIG. 15. The specific operation of the semiconductor integrated circuit 1801 of this embodiment in St35 is as follows.

When the value of the x bit counter 1815 is equal to the number of pulses of the test clock that has been designated at the x bit of the test time setting register 1811 (that is, the test execution time), the value output by the comparator 1821 becomes 1. At this time, a test stop signal of 1 is output from the test stop terminal 506 and input directly to the terminal 620 of the clock control portion 1810. The signal that is output from the AND gate 616 at this time is logical value 0, and therefore the flip-flops 605 and 606 become 0. Consequently, the logical value of the signal that is output from the clock output terminal 603 is again fixed at 0, and thus the x bit counter 1815 stops counting up. At the same time, the generation of pseudo random numbers from the test input data generation portion 511 and the operation of the MISR 1850 are stopped.

Next, in step St36, it is determined whether the total number of repetitions set in step St33 is finished. If not finished, then the procedure advances to step St37, and if all the repetitions are finished, then the procedure advances to step St38.

In step St37, an analysis of the test results is performed and the next expected value of the MISR 1850 is set and input. More specifically, in step St35, the clock signal from the PLL 604 is always input to the PLL clock terminal 1701, and the comparator 1821 outputs a value of 1. For this reason, the clock signal from the PLL 604 is input to the y bit counter 1816, and the y bit counter 1816 starts counting up. Moreover, as mentioned above, in step St35, the clock signal that is output from the clock output terminal 603 is stopped, during which time a test results analysis operation is performed to analyze the value of the MISR 1850. It should be noted that when the time period (required number of pulses) for executing the analysis of the test results is to be designated in the y bit of the test time setting register 1811, a sufficient amount of time for performing the test results analysis operation must be estimated in advance from the clock frequency of the test clock and the clock frequency of the PLL 604, for example.

The operation of the test results analysis portion 1813 while a 0 is output from the test stop terminal 506 is the same as the test results analysis portion 513. On the other hand, in step St37, when the test is stopped by a test stop signal of 1 from the test stop terminal 506, a clock signal is given from the test clock terminal 507 and the MISR 1850 and the expected value register 1851 perform a shift register operation, through which the values stored in the MISR 1850 and the expected value register 1851 are read out one bit at a time and compared at the ExOR 1852. The result of this comparison can be observed at the determined result output terminal 504 to distinguish whether the test results stored in the MISR 1850 are normal or indicate a fault.

Then, when the value of the y bit counter 1816 becomes equal to the value of the y bit of the test time setting register 1811, the value that is output from the comparator 1822 becomes 1. At the same time when the z bit counter 1817 is counting up by 1, the x bit counter 1815 and the y bit counter 1816 are initialized at 0. Thus, the values output by the comparators 1821 and 1822 and the logical value of the signal of the test end terminal 1807 become 0.

In the test results analysis according to this embodiment, the clock signal is input from the test clock terminal 507 so that the values of the MISR 1850 and the values of the expected value register 1851, which stores the expected values when the tested circuit portion 514 is normal, are compared one by one. Moreover, through observing the results of this comparison at the determined result output terminal 504 it is possible to determine whether there is a fault at the tested circuit portion 504, and at the same time, the expected values of the MISR 1850 the next time the procedure is repeated are set and input to the expected value register 1851 from the expected value setting register 509 at the same time when the values of the expected value register 1851 are read out using the clock signal from the test clock terminal 507.

All of the values of the MISR 1850 are read out from the test results data output terminal 505, and the values that are read out serve as the data for fault diagnosis. When these actions are finished, the value of the test clock terminal 507 is once again fixed at 0.

Then, when the test results analysis time when was set in the y bit of the test time setting register 1811 has passed, the value of the test stop terminal 506 becomes 0 and the procedure is returned to step St35. This repeating operation continues until the value of the z bit counter 1817 becomes the value set in the z bit of the test time setting register 1811 (that is, the number of times to repeat the test and the analysis of test results).

Each time the test and the analysis of the test results are repeated, the counter 1817 counts up. When the value of the z bit counter 1817 is equal to the value of the z bit of the test time setting register 1811 (that is, when the number of times to repeat the test and the analysis of the test results reaches the set value), the output value of the comparator 1823 is 1, the test stop terminal 1807 and the test stop terminal 505 both become 1, and the test is ended.

Fault diagnosis through a BIST can be performed by the above operation.

The operation of the clock control portion 1810 of the semiconductor integrated circuit 1801 is substantially the same as that according to Embodiment 5, and as shown in FIGS. 15A and 15B, the pulse of the clock signal that is output from the PLL 604 is output as a fully-shaped pulse from the AND gate 606 of the clock control portion 1810. Consequently, the clock signal output from the PLL 604 is supplied to the various portions in the circuit (the test input data generation portion 511, the test end portion 1812, the test results analysis portion 1813, and the tested circuit portion 514) in fully-shaped pulses, and therefore the various portions in the circuit are kept from malfunctioning.

That is, by using the PLL 604 in the semiconductor integrated circuit 1801, it is possible to employ a clock signal at the frequency during actual operation, which is required for a BIST, and thus a high-speed tester is not necessary.

Particularly in a case where the test results analysis portion 1813 of this embodiment is employed, the values of the test results that are stored in the MISR 1850 can be read out from the test results data output terminal 505 one bit at a time in synchronization with the clock signal from the test clock terminal 507, so that it is possible to acquire information for specifying the location of faults within the circuit. The test results analysis portion 1813 of this embodiment is also capable of functioning as a circular shift register, in which the bit values that are output from the MISR 1850 are fed back to the bits via a line FL, and therefore, when the values are finished being read out from the MISR 1850, the values in the MISR 1850 are once again returned to their pre-readout state. This characteristic can be employed to perform fault diagnosis.

It should be noted that a feedback line FL for returning the vales of the bits output from the MISR 1850 to those bits has been provided in this embodiment, but a configuration in which the line FL is not provided is of course also possible.

Embodiment 8

Figure 22:
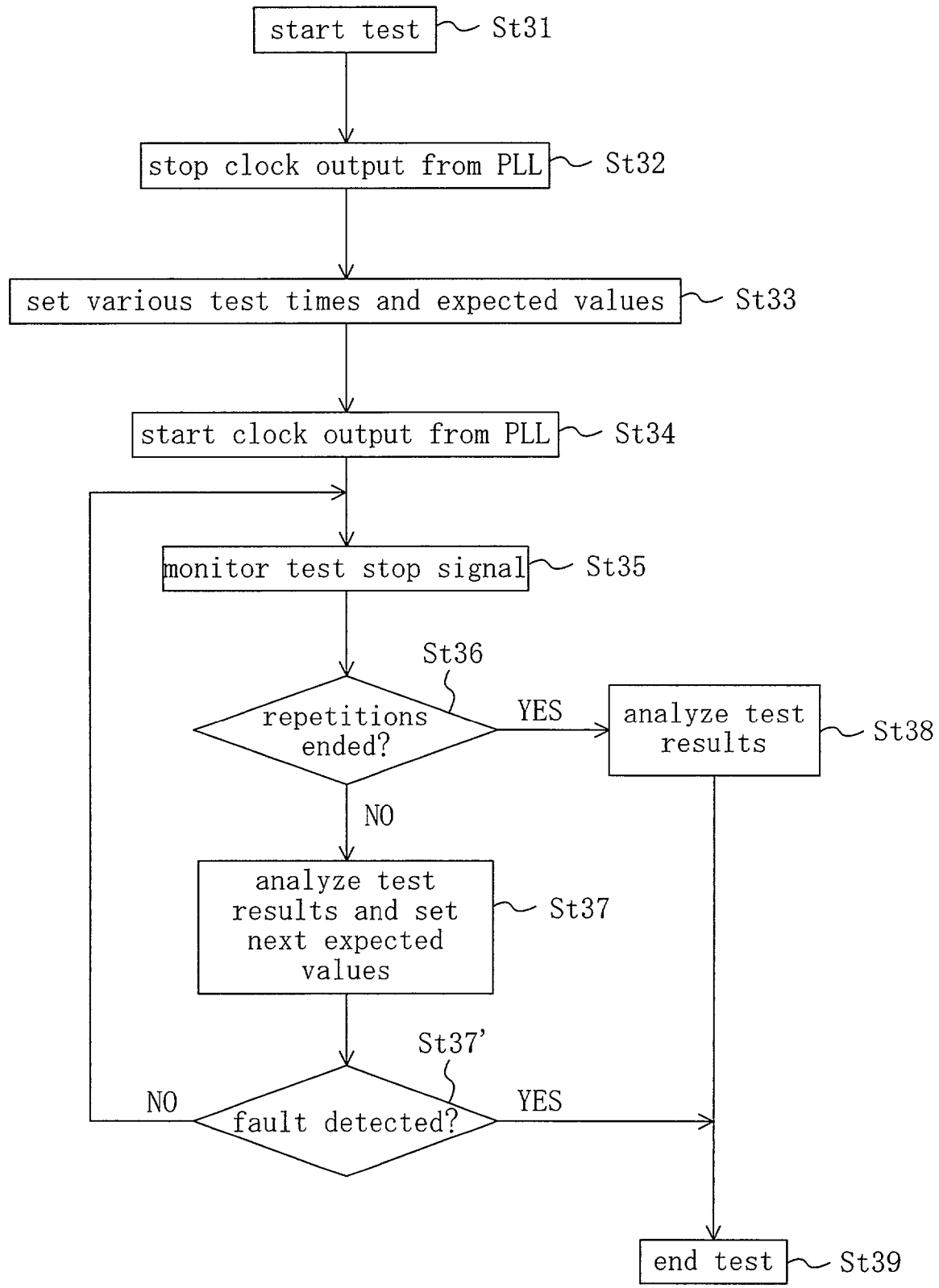
FIG. 22 is a flow chart showing a BIST in which the semiconductor integrated circuit is to be tested.
Figure 23:
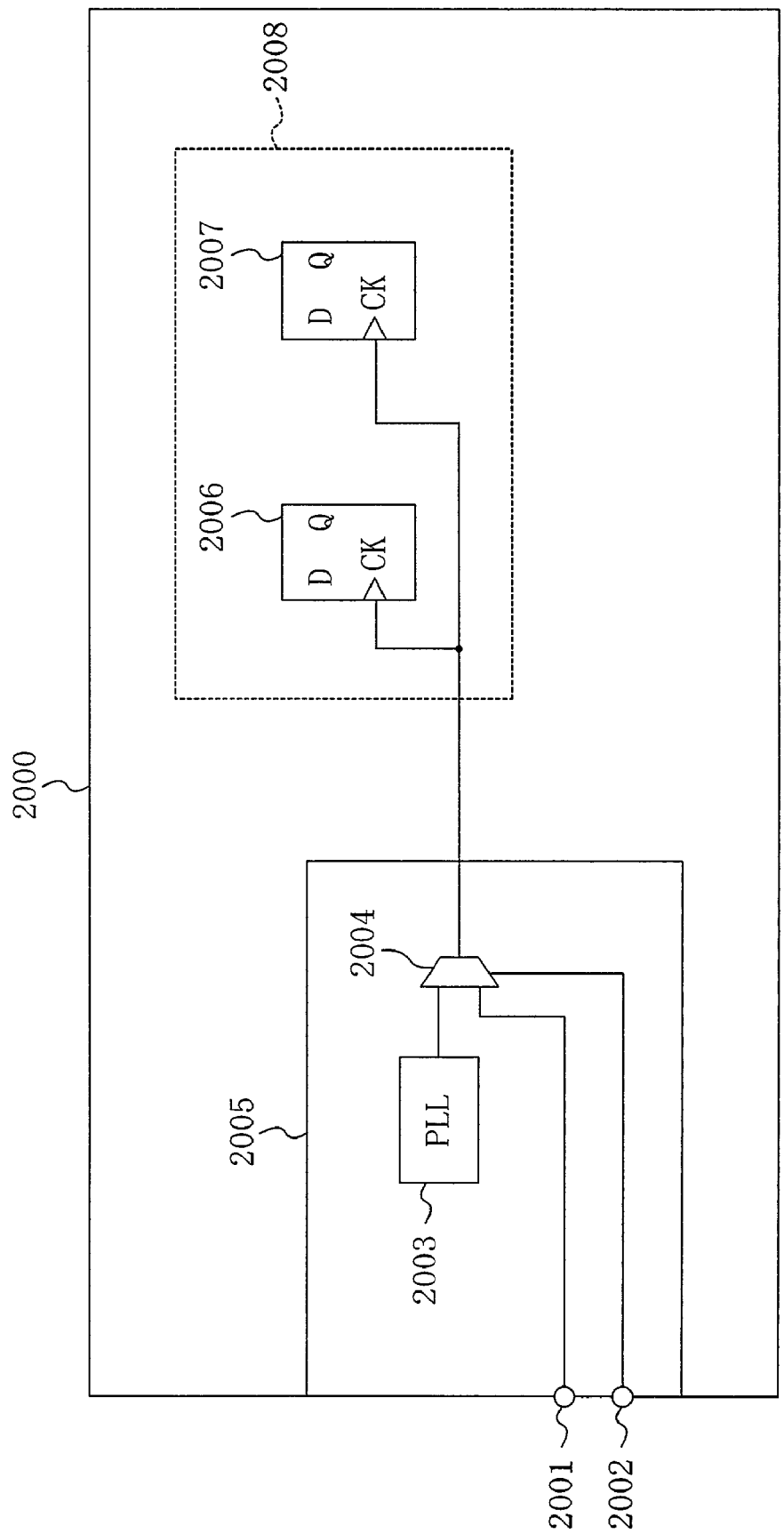
FIG. 23 is a circuit diagram showing a conventional semiconductor integrated circuit.

In this embodiment, the semiconductor integrated circuit testing method shown in FIG. 22 is described as the method for testing the semiconductor integrated circuit 501. FIG. 22 is a flow chart showing a method of testing the semiconductor integrated circuit 1801. The semiconductor integrated circuit testing method shown in FIG. 22 differs from the semiconductor integrated circuit testing method of Embodiment 7 only in the step St37' for monitoring the signal of the test stop terminal 506, and all the other steps are identical to Embodiment 7. Therefore, only the step St37' is described below.

In step St37', it is determined whether a fault has been detected. More specifically, in step St37', it is determined whether a fault was observed at the determined result output terminal 504 in step St37, and if a fault is not observed, the procedure automatically returns to step St35 once the test results analysis time set at the y bit of the test time setting register 1811 has passed.

On the other hand, if a fault is observed, then the procedure is advanced directly to step St39 and the test is ended. In this case, fault diagnosis is performed using the fault values that are read out from the MISR 1850 at the point that the fault was detected last and the normal values read out from the MISR 1850 during the test results analysis operation up to that particular repeat (the values when the effects of the fault are not seen).

With the semiconductor integrated circuit testing method of this embodiment, the test is ended at the point that a fault is detected, and thus testing time can be reduced compared to that of Embodiment 7.

According to this invention, it is possible to execute a test by employing a clock frequency with a stable waveform and at the same frequency as that during actual operation.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor integrated circuit comprising:
a clock control portion having a clock generation portion for generating a clock signal and an output command signal input portion for receiving a clock output command signal from the outside, and
an internal circuit controlled by an output clock signal that is output from the clock control portion,
wherein the clock control portion outputs the output clock signal of a predetermined number of pulses to the internal circuit when a certain time period has passed from a time when the output command signal is received, and the clock control portion stops the output clock signal automatically after outputting the output clock signal of the predetermined number of pulses,
wherein the clock control portion selectively outputs the generated clock signal from the clock generation portion or an external clock signal from the outside of the semiconductor integrated circuit according to a clock switching signal, and wherein the generated clock signal from the clock generation portion is used for a normal operation mode of a scan test and the external clock signal is used for a shift operation mode.

2. The semiconductor integrated circuit according to claim 1, wherein the clock control portion outputs a signal of a constant logical value to the internal circuit after the output clock signal of a certain number of pulses has been output to the internal circuit.

3. The semiconductor integrated circuit according to claim 1, wherein the internal circuit comprises a test input data generation portion, a test end control portion, a test results analysis portion, and a tested circuit portion, and
wherein the test input data generation portion, the test end control portion, and the test results analysis portion test the tested circuit portion using the output clock signal.

4. The semiconductor integrated circuit according to claim 3, wherein the test end control portion comprises a circuit for detecting the number of pulses of the output clock signal, and a stop signal output portion for outputting a stop signal to stop output of the output clock signal to the internal circuit when the number of pulses of the output clock signal reaches a certain number of pulses.

5. The semiconductor integrated circuit according to claim 4, wherein the clock control portion is connected so as to receive the stop signal that is fed back from the stop signal output portion, and outputs a signal of a constant logical value to the internal circuit when the stop signal has been output to the stop signal output portion.

6. The semiconductor integrated circuit according to claim 3, wherein the test end control portion further comprises an end signal output portion for outputting an end signal to the outside in order to end the test, and wherein the output of the output clock signal from the clock control portion to the internal circuit and a readout of results input to the test results analysis portion due to said output are performed repeatedly, and once a number of repetitions has reached a certain number, the test end control portion outputs the end signal to the end signal output portion.

7. The semiconductor integrated circuit according to claim 3, wherein the test end control portion comprises a register having a first numerical value input portion and a stop signal output portion for outputting a stop signal to stop output of the output clock signal to the internal circuit, and wherein the stop signal is output by the stop signal output portion when the number of pulses of the clock signal output from the clock control portion matches a numerical value of the first numerical value input portion.

8. The semiconductor integrated circuit according to claim 7, wherein the test end control portion further comprises an end signal output portion for outputting an end signal to the outside, and the register further comprises a second numerical value input portion as well as a third numerical value input portion into which an arbitrary numerical value can be input from the outside, wherein an output of the output clock signal from the clock control portion to the internal circuit, a readout of the results input to the test results analysis portion due to said output, and an output of the stop signal from the test end control portion to the stop signal output portion when the number of pulses required for said readout matches a numerical value of the second numerical value input portion are performed in repetition, and wherein the test end control portion outputs a test end signal to the end signal output portion when a number of repetitions of the output of the output clock signal, the readout, and the output of the stop signal matches a numerical value of the third numerical value input portion.

9. The semiconductor integrated circuit according to claim 8, wherein any numerical value can be input into the first numerical value input portion and the second numerical value input portion from the outside.

10. The semiconductor integrated circuit according to claim 9, wherein the first numerical value input portion, the second numerical value input portion, and the third numerical value input portion constitute a scan chain through which numerical values are input.

11. The semiconductor integrated circuit according to claim 3, wherein the test results analysis portion comprises a test results register for storing actually observed values of the test results of the tested circuit portion, an expected value register for storing expected values of the test results of the tested circuit portion, and a comparator portion for comparing the actually output values of the test results with the expected values of the test results.

12. The semiconductor integrated circuit according to claim 11, wherein the test results register is provided with a function for outputting the actually output values of the test results of the tested circuit portion one bit at a time, and wherein the comparator portion performs the comparison one bit at a time.

13. The semiconductor integrated circuit according to claim 11, wherein the comparator portion is provided with a function for grouping the actually output values that are output from the test results register and the expected values that are output from the expected value register and comparing them in response to an input of a single pulse clock signal.

14. A method of testing a semiconductor integrated circuit that is provided with a clock control portion having a clock generation portion for generating a clock signal based on a clock signal from an oscillation circuit employed during actual operation and an output command signal input portion for receiving an output command signal from the outside, and with an internal circuit controlled by an output clock signal that is output from the clock control portion, the semiconductor integrated circuit being configured such that the output clock signal of a predetermined number of pulses is output to the internal circuit when a certain time period has passed from a time when the output command signal is received, wherein after said time, the internal circuit is tested through a scan technique using the output clock signal, wherein the clock control portion selectively outputs the generated clock signal from the clock generation portion or an external clock signal from the outside of the semiconductor integrated circuit according to a clock switching signal, and wherein the generated clock signal from the clock generation portion is used for a normal operation mode of a scan test and the external clock signal is used for a shift operation mode.

15. The method of testing a semiconductor integrated circuit according to claim 14, wherein the clock control portion further includes a test clock signal input portion for receiving a test clock signal from the outside, and wherein the test of the semiconductor integrated circuit through a scan technique is a delay test that uses a scan technique, wherein the clock control portion outputs the test clock signal to the internal circuit as the output clock signal prior to said time.

16. The method of testing a semiconductor integrated circuit according to claim 14, wherein the output command signal is the rise or the fall of a logical value.

17. The method of testing a semiconductor integrated circuit according to claim 14, wherein the output command signal is maintained at a constant logical value.

18. The semiconductor integrated circuit according to claim 1, wherein the certain time period is calculated according to the generated clock signal from the clock generation portion.

19. The semiconductor integrated circuit according to claim 1, wherein the predetermined number of pulses is calculated according to the generated clock signal from the clock generation portion.

* * * * *